US010229770B2

(12) United States Patent
Cornelius et al.

(10) Patent No.: US 10,229,770 B2
(45) Date of Patent: Mar. 12, 2019

(54) UNIFIED CONNECTOR FOR MULTIPLE INTERFACES

(71) Applicant: Apple Inc., Cupertino, CA (US)

(72) Inventors: William P. Cornelius, Saratoga, CA (US); Paul A. Baker, Los Altos, CA (US); William O. Ferry, San Jose, CA (US); Min Chul Kim, Santa Clara, CA (US); Nathan N. Ng, Fremont, CA (US)

(73) Assignee: APPLE INC., Cupertino, CA (US)

( * ) Notice: Subject to any disclaimer, the term of this patent is extended or adjusted under 35 U.S.C. 154(b) by 883 days.

(21) Appl. No.: 14/522,513

(22) Filed: Oct. 23, 2014

(65) Prior Publication Data

US 2015/0137861 A1 May 21, 2015

Related U.S. Application Data

(60) Provisional application No. 61/894,895, filed on Oct. 23, 2013, provisional application No. 61/900,381, (Continued)

(51) Int. Cl.
*H01B 11/20* (2006.01)
*H01B 11/18* (2006.01)
(Continued)

(52) U.S. Cl.
CPC ............ *H01B 7/0009* (2013.01); *G01D 5/12* (2013.01); *G01R 31/08* (2013.01); *G06F 13/405* (2013.01); *H01B 9/006* (2013.01); *H01B 11/1891* (2013.01); *H03L 9/00* (2013.01); *H01B 11/20* (2013.01)

(58) Field of Classification Search
CPC ...... G01R 31/08; G01R 31/088; G01R 31/11; H01L 24/69; H01L 24/68; G01D 5/12; H03L 9/00
See application file for complete search history.

(56) References Cited

U.S. PATENT DOCUMENTS 4,603,320 A 7/1986 Farago
2004/0177197 A1 9/2004 McLeod
(Continued)

FOREIGN PATENT DOCUMENTS

EP 2 590 274 A2 5/2013
TW 201333501 A 8/2013
(Continued)

OTHER PUBLICATIONS

Taiwan Office Action (English Translation) and Search Report dated Jun. 27, 2017 in Taiwanese Patent Application No. 103136725, 3 pages.

(Continued)

*Primary Examiner* — Timothy J Thompson
*Assistant Examiner* — Rhadames Alonzo Miller
(74) *Attorney, Agent, or Firm* — Kilpatrick Townsend & Stockton, LLP

(57) ABSTRACT

Circuits, methods, and apparatus that may reduce the number of connector receptacles that are needed on an electronic device. One example may provide a unified connector and circuitry that may be capable of communicating with more than one interface.

20 Claims, 43 Drawing Sheets

Related U.S. Application Data filed on Nov. 5, 2013, provisional application No. 61/926,376, filed on Jan. 12, 2014, provisional application No. 62/065,744, filed on Oct. 19, 2014.

(51) Int. Cl.

| | | |
|---|---|---|
| *G01D 5/12* | (2006.01) | |
| *H01B 7/00* | (2006.01) | |
| *H01B 9/00* | (2006.01) | |
| *H03L 9/00* | (2006.01) | |
| *G06F 13/40* | (2006.01) | |
| *G01R 31/08* | (2006.01) | |

(56) References Cited

U.S. PATENT DOCUMENTS

| | | | |
|---|---|---|---|
| 2006/0024997 A1* | 2/2006 | Teicher | H01R 27/00 |
| | | | 439/217 |
| 2010/0080563 A1* | 4/2010 | DiFonzo | G02B 6/3817 |
| | | | 398/115 |
| 2012/0233489 A1 | 9/2012 | Cornelius et al. | |
| 2013/0115817 A1* | 5/2013 | Terlizzi | H01R 13/6683 |
| | | | 439/620.21 |
| 2013/0217253 A1* | 8/2013 | Golko | H01R 13/516 |
| | | | 439/345 |

FOREIGN PATENT DOCUMENTS

| | | |
|---|---|---|
| WO | 02/088975 A1 | 11/2002 |
| WO | 2011/150403 A1 | 12/2011 |

OTHER PUBLICATIONS

Office Action (English Translation) dated Dec. 19, 2016 in Taiwan Patent Application No. 103136725, 4 pages.

Taiwan Office Action dated Jan. 21, 2016 for Taiwan Application No. 103136725.

Invitation to Pay Additional Fees and, Where Applicable, Protest Fee with Partial International Search Report dated Feb. 5, 2015 for PCT Patent Application No. PCT/US2014/062015, 5 pages.

International Search Report and Written Opinion of the International Searching Authority dated Sep. 21, 2015 for International Application No. PCT/US2014/062015, 14 pages.

International Preliminary Report on Patentability dated May 6, 2016, for International Application No. PCT/US2014/062015, 10 pages.

\* cited by examiner

| LEGACY INTERFACE 1 | LEGACY INTERFACE 2 | UNIFIED INTERFACE |
|---|---|---|
| TX0 | TX0 | TX0 |
| TX1 | TX1 | TX1 |
| TX2 | CONTROL (IN) | TX2 / LSTX0 |
| TX3 | CONTROL (OUT) | TX3 / LSRX1 |
| AUX (OUT) | RX0 | LSRX1 / RX0 |
| CONTROL (OUT) | RX1 | LSRX2 / RX1 |

FIG. 4

| LEGACY INTERFACE 1 | LEGACY INTERFACE 2 | UNIFIED INTERFACE |
|---|---|---|
| TX0 | TX0 | TX0 |
| TX1 | TX1 | TX1 |
| TX2 | RX0 | TX2 / RX0 |
| TX3 | RX1 | TX3 / RX1 |
| AUX | CONTROL | AUX / CONTROL |
| CONTROL | CONTROL | CONTROL |

FIG. 10

| LEGACY INTERFACE 1 | LEGACY INTERFACE 2 | UNIFIED INTERFACE |
|---|---|---|
| TX0 | TX0 | TX01 |
| TX1 | TX1 | |
| TX2 | CONTROL | TX23 / LSTX |
| TX3 | CONTROL | |
| AUX | RX0 | LSRX / RX01 |
| CONTROL | RX1 | |

FIG. 13

| UNIFIED CONNECTOR PINOUT | | |
|---|---|---|
| P | TX0 | TX0 | P | LSI | AP | LSTX | G | RX0 | RX0 | G |
| G | RX1 | RX1 | G | LSRX | CP | LSI | P | TX1 | TX1 | P |

FIG. 39

| UNIFIED CONNECTOR PINOUT | | |
|---|---|---|
| G | TX0 | P | LSI | AP | LSTX | P | RX0 | G |
| G | RX1 | P | LSRX | CP | LSI | P | TX1 | G |
| G | RX1 | P | LSRX | CP | LSI | P | TX1 | G |
| G | TX0 | P | LSI | AP | LSTX | P | RX0 | G |

FIG. 40

| UNIFIED CONNECTOR PINOUT | | |
|---|---|---|
| | G | P |
| | RX0 | TX1 |
| | RX0 | TX1 |
| | G | P |
| | LSTX | LSI |
| | LSI | LSRX |
| | P | G |
| | TX0 | RX1 |
| | TX0 | RX1 |
| | P | G |

FIG. 41

UNIFIED CONNECTOR FOR MULTIPLE INTERFACES

CROSS-REFERENCES TO RELATED APPLICATIONS

This application is a nonprovisional of and claims the benefit of U.S. provisional patent application Nos. 61/894,895, filed Oct. 23, 2013, 61/900,381, filed Nov. 5, 2013, 61/926,376, filed Jan. 12, 2014, and 62/065,744, filed Oct. 19, 2014, which are incorporated by reference.

BACKGROUND

The amount of data transferred between electronic devices has grown tremendously the last several years. Large amounts of audio, streaming video, text, and other types of data content are now regularly transferred among portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices.

These data transfers may occur over various media. For example, the data transfers may be made wirelessly, over wire conductors, over fiber optic cables, or they may be made in other ways. Power may be transferred with the data, or power may be transferred separately. For example, power and data may be transferred from one electronic device to another, or power may be separately transferred from a battery, charging circuit, or power converter to an electronic device.

Power and data may be conveyed over cables that may include wire conductors, fiber optic cables, or some combination of these or other conductors. Cable assemblies may include a connector insert at each end of a cable, though other cable assemblies may be connected or tethered to an electronic device in a dedicated manner. The connector inserts may be inserted into receptacles in the communicating electronic devices.

The conveyed power and data may be arranged to be compliant with one of a number of various interfaces. Typically, an electronic device needs a separate connector receptacle to communicate with each of these various interfaces. This may cause an electronic device to have a number of connector receptacles, which can result in customer confusion, may increase device cost and complexity, and lend a non-optimal appearance to the electronic device. Product launch cycles may also be lengthened since design effort may be required for each different receptacle and circuitry related to them.

Thus, it would be desirable to reduce the number of connector receptacles that are needed on an electronic device. Also, since so much data is transferred between devices, it would also be desirable that the remaining connector receptacles be capable of high-speed data transmission.

SUMMARY

Accordingly, embodiments of the present invention may provide circuits, methods, and apparatus that may reduce the number of connector receptacles that are needed on an electronic device. An illustrative embodiment of the present invention may provide a unified connector and circuitry that may be capable of communicating with more than one signal interface. This unified connector may also be capable of transferring data at high data rates using a unified or legacy interface.

An illustrative embodiment of the present invention may provide an electronic device housing a unified connector receptacle and circuitry to receive and transmit data consistent with a unified interface using the unified receptacle. The electronic device may communicate with a second electronic device using a cable. The cable may have a corresponding unified connector insert or plug at a first end to mate with the unified receptacle in the electronic device. In various embodiments of the present invention, the cable may have a second unified connector insert or plug at a second end of the cable to mate with a second unified connector receptacle on a second device. The cable may then provide pathways for signals consistent with either a unified or legacy interface.

In other embodiments of the present invention, the cable may have a second plug that may be consistent with a legacy interface. In this case, either the first plug or the second plug may include circuitry to convert signals consistent with the unified interface into a legacy interface.

Another illustrative embodiment of the present invention may provide an electronic device housing a unified connector receptacle and circuitry to receive and transmit data using the unified receptacle. The electronic device may communicate with a second electronic device using a dongle connected to a cable. The dongle may have a corresponding unified connector insert or plug at a first end to mate with the unified receptacle. The plug may include circuitry to pass signals at the unified plug interface to a unified connector receptacle at a second end of the dongle. The receptacle at the second end of the dongle may include circuitry to covert the signals in a unified interface to a legacy interface, which may then be passed via the cable to the second electronic device.

An illustrative embodiment of the present invention may provide a unified connector and circuitry that may communicate with more than one interface where each signal in each of the possible interfaces is provided over a unified connector. For example, if a unified connector and circuitry may communicate using a first interface having X signals or a second interface having Y signals, the unified connector may have sufficient pins to convey X+Y signals.

In other embodiments of the present invention, the number of pins in the unified connector may be reduced. In various embodiments of the present invention, this reduction in the number of pins may be accomplished by sharing connector pins and associated circuitry portions among more than one legacy interface. In this case, if a unified connector and circuitry may communicate using a first interface having X signals or a second interface having Y signals, the unified connector may have fewer than X+Y signal pins.

Legacy interfaces may be interfaces such as Universal Serial Bus (USB), High-Definition Multimedia Interface® (HDMI), Digital Visual Interface (DVI), power, Ethernet, DisplayPort, Thunderbolt™, Lightning™ and other types of standard and non-standard interfaces. A legacy connector may be used to convey signals according to or consistent with a legacy interface. Legacy signals may be signals that are included in these legacy interfaces. A unified interface may be used to convey signals according to or consistent with one or more legacy interfaces. A unified interface may also be used to convey signals not associated with a legacy interface. In various embodiments of the present invention, a unified interface may be a USB-C or other type of interface. A unified connector may be used to convey signals according to or consistent with a unified interface.

For simplicity, legacy and unified interfaces may be shown herein as having up to three types of signals, high-speed data signals (which may be on the order of 5-100 GHz, for example 20 GHz), low-speed data signals (which may be 1-10 GHz, for example 5 GHz), and control or auxiliary signals (which may be closer to DC) where control or auxiliary signals may be signals to control a state or mode, or to program a state of mode of one or more circuits or devices. Legacy high or low-speed data signals may be low swing, low voltage differential signals, while control or auxiliary signals may be higher voltage single-ended or differential signals. In other embodiments of the present invention, other types of signals may be included. The set of types of signals is limited herein for simplicity.

An illustrative embodiment of the present invention may reduce the number of pins needed in a unified connector by sharing pins and associated circuitry among high or low-speed data transmit signals in different legacy interfaces. That is, a first circuit may receive a first transmit signal when a first legacy interface is used and a second transmit signal when a second legacy interface is used. The transmit signals may be high or low-speed. The first circuit may provide a unified transmit signal over a unified connector, where the unified transmit signal conveys the first transmit signal when the first legacy interface is used and the second transmit signal when the second legacy interface is used. Similarly, pins may be shared among high or low-speed data receive signals in different legacy interfaces.

In this and other embodiments of the present invention, transmit and receive paths may also share pins with control or auxiliary signals in other standards. Also in this example, transmit and receive signals may be AC coupled through capacitors. This may complicate sharing pins among transmit and receive signals in one legacy standard and a control or auxiliary signal in a second standard, since a control or auxiliary signal may be a DC or near DC signal, and DC information is lost through AC-coupling capacitors.

Accordingly, this and other embodiments of the present invention may convert a control or auxiliary signal into an AC signal, which may then be passed through an AC-coupling capacitor. This may be done by encoding the control or auxiliary signal using a Manchester or other appropriate encoding. The amplitude may also be reduced. This may provide a DC-balanced, low-voltage AC signal that may share pins in a unified connector with transmit or receive signals from other legacy standards. The encoded data frequency may be higher, for example in the 10 to 100 MHz range, such that they may be passed through an AC-coupling capacitor.

In this and other embodiments of the present invention, the number of pins in a unified connector may be further reduced by combining two or more control or auxiliary signals within a legacy interface. For example, two control or auxiliary signals within a legacy interface may be time-domain multiplexed and provided as a combined signal over the unified connector. In other embodiments of the present invention, state updates showing the present states of two control or auxiliary signals within a legacy interface may be transmitted as a single combined signal over a unified connector.

Another illustrative embodiment of the present invention may separate transmit and data lines from control or auxiliary signals. In this example, high and low-speed transmit and data signals among different legacy interfaces may share pins in a unified connector. These signals may be AC coupled. Control or auxiliary signals may be higher voltage and DC coupled. As before, more than one control or auxiliary signals within a legacy interface may share a signal path through a unified connector. Again, two control or auxiliary signals within a legacy interface may be time-domain multiplexed and provided as a combined signal over the unified connector. In other embodiments of the present invention, state updates showing the present states of two control or auxiliary signals within a legacy interface may be transmitted as a single combined signal over a unified connector.

In these and other embodiments of the present invention, the number of pins in a unified connector may be reduced by interleaving one or more data signals within a legacy standard to generate a single signal of a unified interface, which may be at a higher frequency. For example, a legacy interface may include two transmit data signals. These signals may be interleaved and provided over a unified connector as a single combined signal.

Embodiments of the present invention may provide cables that may be reversible and have rotatable plugs at one or both ends. A cable may be reversible when a first plug in a receptacle in a first device and a second plug in a receptacle in a second device may be swapped such that the first plug is inserted into the receptacle in the second device and the second plug is inserted into the receptacle in the first device while maintaining functionality. A plug may be rotatable if it may be inserted into a corresponding receptacle in any of at least two orientations.

Embodiments of the present invention may provide connector receptacles and inserts that may be located in, and may connect to, various types of devices, such as portable computing devices, tablet computers, desktop computers, laptops, all-in-one computers, wearable computing devices, cell phones, smart phones, media phones, storage devices, portable media players, navigation systems, monitors, power supplies, adapters, remote control devices, chargers, and other devices. These connector receptacles and inserts may provide pathways for signals that are compliant with various standards such as Universal Serial Bus (USB), USB-2, USB-3, USB-C, High-Definition Multimedia Interface (HDMI), Digital Visual Interface (DVI), Ethernet, DisplayPort, Thunderbolt, Lightning, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In various embodiments of the present invention, these interconnect paths provided by these connector receptacles and inserts may be used to convey power, ground, signals, test points, and other voltage, current, data, or other information.

Various embodiments of the present invention may incorporate one or more of these and the other features described herein. A better understanding of the nature and advantages of the present invention may be gained by reference to the following detailed description and the accompanying drawings.

BRIEF DESCRIPTION OF THE DRAWINGS

FIG. 4 illustrates a signal mapping according to an embodiment of the present invention;

FIG. 10 illustrates a signal mapping according to an embodiment of the present invention;

FIG. 13 illustrates a signal mapping according to an embodiment of the present invention;

FIG. 39 illustrates a pinout for a unified connector according to an embodiment of the present invention;

FIG. 40 illustrates a pinout for a unified connector according to an embodiment of the present invention;

FIG. 41 illustrates a pinout for a unified connector according to an embodiment of the present invention;

DESCRIPTION OF ILLUSTRATIVE EMBODIMENTS

Figure 1:
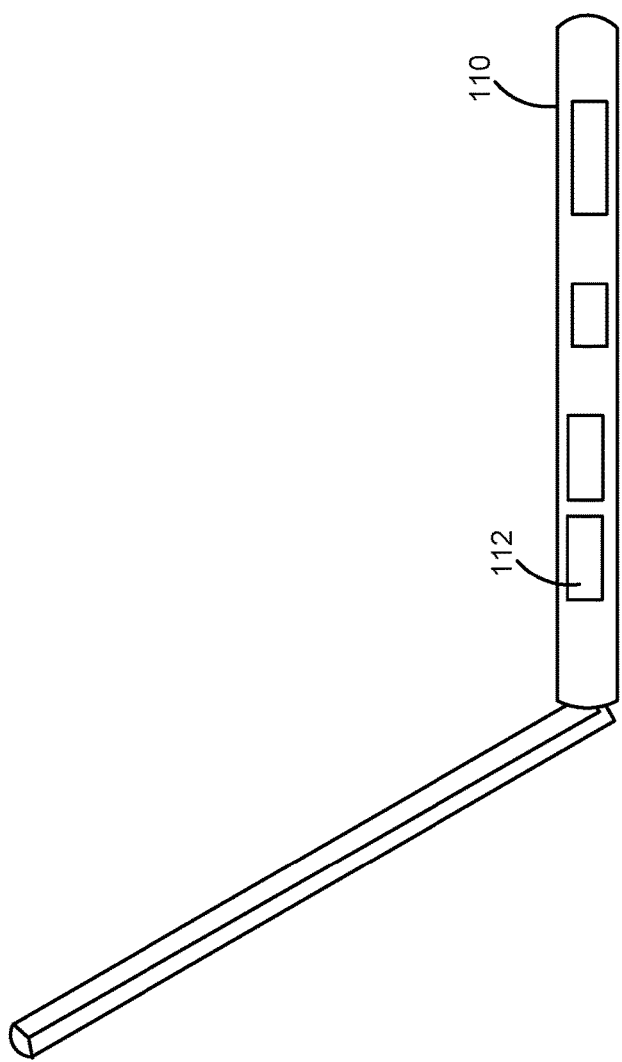
FIG. 1 illustrates an electronic device that may be improved by the incorporation of an embodiment of the present invention.

FIG. 1 illustrates an electronic device that may be improved by the incorporation of an embodiment of the present invention. This figure, as with the other included figures, is shown for illustrative purposes and does not limit either the possible embodiments of the present invention or the claims.

This figure illustrates an electronic device 110 having a number of connector receptacles 112. Each connector receptacle 112 may be compliant with an interface, such as one or more of the Universal Serial Bus interfaces, High-Definition Multimedia Interface, Digital Visual Interface, power, Ethernet, DisplayPort, Thunderbolt, Lightning and other types of standard and non-standard interfaces that exist now, are under development now, or will be developed in the future.

Again, a large number of different types of connector receptacles may cause customer confusion. For example, it may be confusing to a customer trying to drive a monitor to decide whether to use an HDMI, DVI, or Thunderbolt cable. Also, each of these connector receptacles may be individually designed, thereby consuming engineering resources and increasing device costs. Further, each of these connector receptacles may communicate with circuitry inside electronic device 110. This circuitry may require individually designed interfaces for communicating with each of the different connector receptacles. Again, this increase device costs and may lengthen product design schedules.

Accordingly, embodiments the present invention may provide a unified connector that may communicate with two or more different interfaces and protocols. This may allow electronic device 110 to have fewer connector receptacles. Even in cases where no reduction in the number of receptacles is desired, since each receptacle 112 may be identical and may communicate with identical or similar circuitry inside electronic device 110, engineering resources may reach be reduced, device costs may be lowered, and product introduction schedules may be shortened.

In this example, electronic device 110 is shown as being a laptop computer. In other embodiments of the present invention, electronic device 110 may be another type of electronic device, such as a portable computing device, tablet computer, desktop computer, laptop, all-in-one computer, wearable computing device, cell phone, smart phone, media phone, storage device, portable media player, navigation system, monitor, power supply, adapter, remote control device, charger, and other device.

Figure 2:
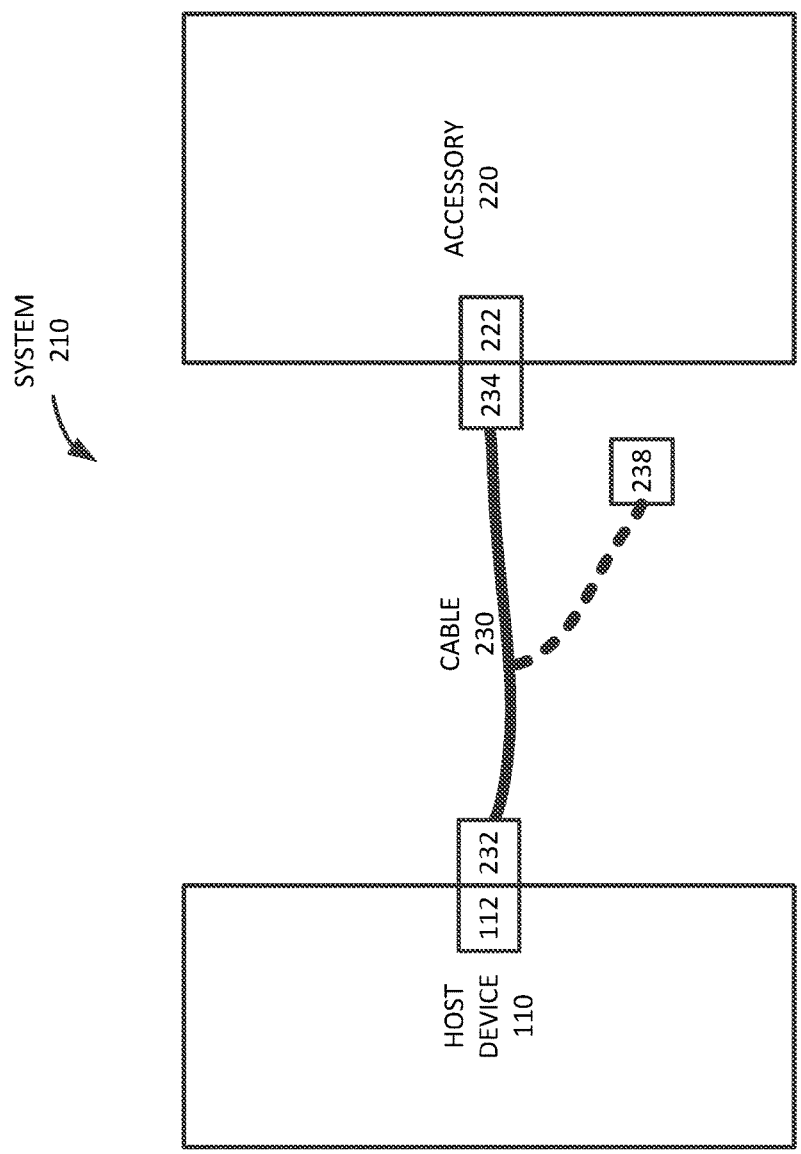
FIG. 2 illustrates an electronic system according to an embodiment of the present invention.

FIG. 2 illustrates an electronic system according to an embodiment of the present invention. Electronic system 210 may include a host device 110 communicating with accessory 220. Host device 110 may include connector receptacle 112. Accessory 220 may include receptacle 222. Host device 110 may communicate with accessory 220 via cable 230. Cable 230 may include connector plugs 232 and 234, which may be mated with receptacles 112 and 222.

More specifically, host device 110 may receive and provide signals and power at receptacle 112. Plug 232 of cable 230 may be inserted into receptacle 112. Plug 234 of cable 230 may be inserted into receptacle 222 in accessory 220. Accessory may receive and provide signals and power at receptacle 222. Either or both receptacles 112 and 222, and corresponding plugs 232 and 234 may be either a unified connector or a legacy connector. For example, connector receptacle 112 and corresponding cable plug 232 may be a unified receptacle and plug, while plug 234 and receptacle 222 may be a legacy plug and receptacle.

In various embodiments of the present invention, cable 230 may be reversible. That is, plug 232 may be inserted in receptacle 222 in accessory 220 and plug 234 may be inserted into receptacle 112 in host 110. The plugs on cable 230 may further be rotatable. That is, plug 232 may be inserted in receptacle 112 in any of two or more orientations. Similarly, plug 234 may be inserted into receptacle 222 in any of two or more orientations.

Conductors in cable 230 may couple pins in legacy plug 234 to pins in unified plug 232. Plugs 232 and 234 may either or both and include one or more active circuit and other electronic components. In this way, signals and power may be shared between host device 110 and accessory 220.

In this example, cable 230 may have a particular legacy plug at one end and a unified plug on the other. This may allow communications between and accessory having a legacy receptacle and a host device having a unified receptacle. In other embodiments of the present invention, the accessory may have a unified receptacle, while the host device may have a legacy receptacle. In still other embodiments, both the host and accessory may have unified receptacles, or both may have legacy receptacles.

In this example, cable 230 may be spliced and optionally connected to additional legacy plug 238. Legacy plug 238 may be compatible with a different legacy interface than legacy plug 234. This may provide a cable assembly that may connect devices having different legacy connectors to a device having a unified connector. As with the other plugs, legacy plug 238 may include one or more active circuitry or other electrical components.

In various embodiment of the present invention, it may be undesirable for a user to have a number of different cables 230. In such a case, it may be desirable to provide a dongle. An example is shown in the following figure.

Figure 3:
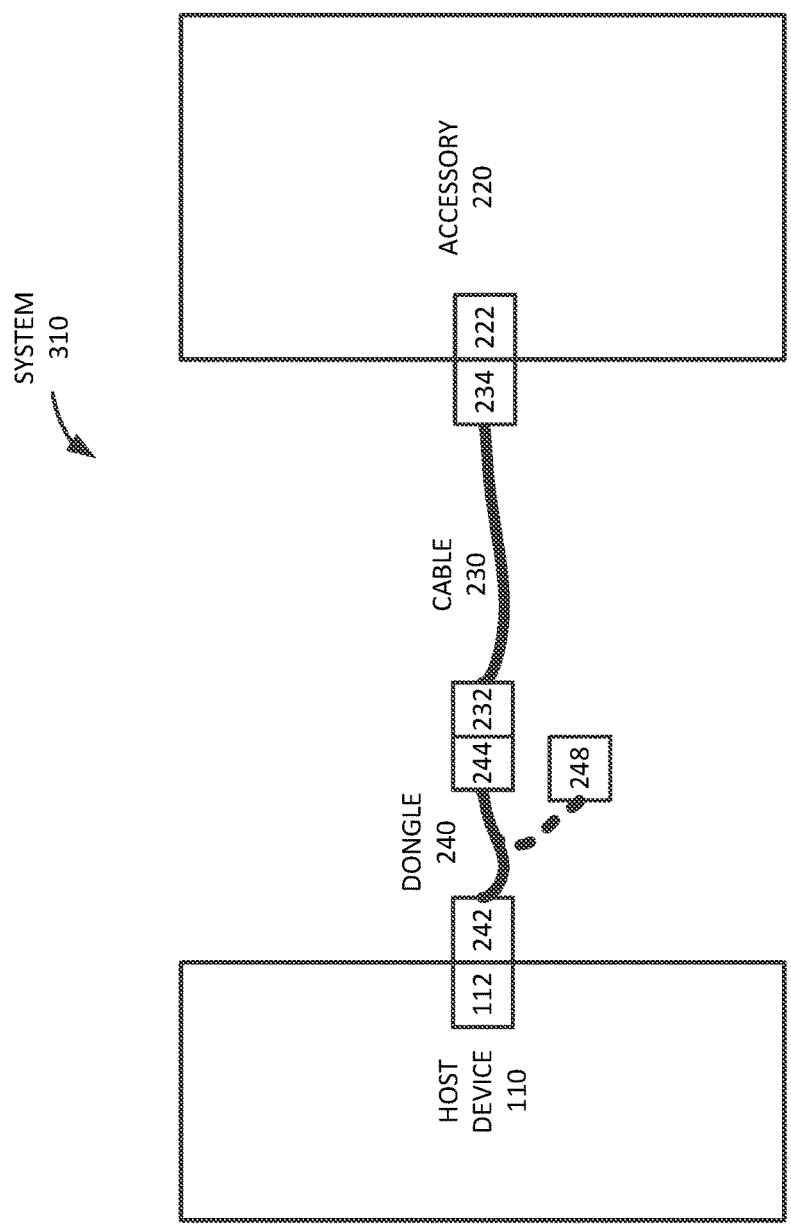
FIG. 3 illustrates an electronic system according to an embodiment of the present invention.

FIG. 3 illustrates an electronic system according to an embodiment of the present invention. Again, host device 110 may communicate with accessory 220. Host device 110 may include receptacle 112. Unified plug 242 may be inserted into receptacle 112. A second end of dongle 240 may include a receptacle 244. Plug 232 of cable 230 may be inserted into receptacle 244, and plug 234 may be inserted into receptacle 222 in accessory 220. In this example, receptacle 212 and plug 242 may be unified connectors, while receptacle 244, plug 232, plug 234, and receptacle 222 may be legacy plugs and receptacles. As before, a receptacle 248 may be compliant with a second legacy standard and may be connected to conductors in dongle 240.

Again, a simple embodiment of the present invention may provide a unified connector that includes a pin or pins for each of the signals in each of the legacy interfaces to be supported. That is, if a first interface having X. pins is to be supported, and a second interface having Y pins is to be supported, this embodiment of the present invention may provide a unified connector having X plus Y pins. In other embodiments of the present invention, the number of pins may be reduced using various techniques. In one example, this may include mapping signals of one interface onto signals of another interface. For example, a transmit signal in one legacy interface may be mapped onto a transit that signal in another legacy interface. That is, a pin or pins in a unified connector may convey a first transmit signal when the unified connector is conveying signals according to a first legacy standard, and a second transmit signal when the unified connector is conveying signals according to a second legacy standard. Similarly, a receive signal in one interface may be mapped onto a receive signal in the other interface. In this and other examples, control signals may be mapped onto transmit or received signals as well. That is, if a first interface having X. pins is to be supported, and a second interface having Y pins is to be supported, this embodiment of the present invention may provide a unified connector having fewer than X plus Y pins. An example is shown in the following figure.

FIG. 4 illustrates a signal mapping according to an embodiment of the present invention. In this example, signals of a first legacy interface and a second legacy interface are mapped to unified interface. It should be noted that the signals listed in this and the other examples are for illustrative purposes and are not intended to accurately represent any particular interface.

In this example, a first legacy interface and a second legacy interface both include two transmit signals. Accordingly, these may be mapped to two transmit signals on the unified interface.

The first legacy interface may further include two more transmit signals, which may be mapped to control signals. One of these control signals may be an input, while the other may be an output. Similarly, control and auxiliary signals in the first legacy interface may be mapped to receive signals in the second legacy interface.

The transmit and receive data signals in this and the other examples shown may be AC coupled. That is, they may be coupled through relatively large AC coupling capacitors. This may help to improve common mode noise rejection and improve device performance. However, a control signals may be a very low-frequency signal. That is, it may have a frequency at or near DC. Such a signal may be effectively blocked by an AC-coupling capacitor. (In fact, AC-coupling capacitors are often referred to as DC blocking capacitors.) Accordingly, without more, a control signal may have trouble sharing a pin of a unified connector with a transmit or receive signal. Accordingly, embodiments of the present invention may convert the control signals into an AC signal. This may be done by encoding the signal to generate a DC balanced AC signal. The frequency of this DC balance signal may be set comparatively high, for instance 10-100 MHz, such that the modified control signal may pass through the AC coupling capacitor.

Figure 5:
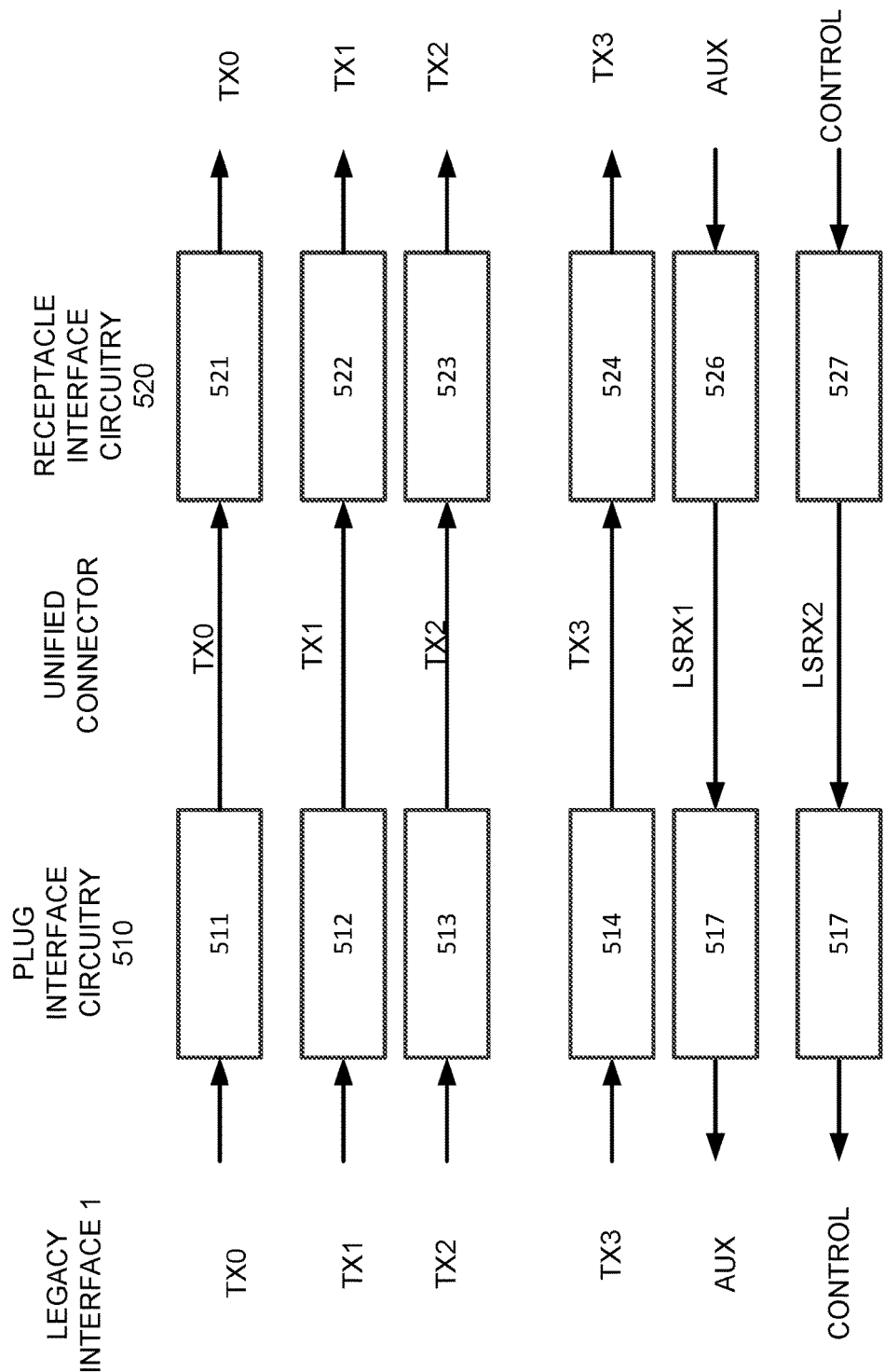
FIG. 5 illustrates a unified connector and circuitry according to an embodiment of the present invention.

FIG. 5 illustrates a unified connector and circuitry according to an embodiment of the present invention. This figure includes the first legacy interface including a number of signals that may be conveyed on conductors of cable 230. Plug interface circuitry 510 may be included in a cable plug such as cable plugged 232. A unified connector may provide signals to a receptacle and receptacle interface circuits 520.

Plug interface circuitry 510 may include circuits 511 and 512 for passing transmit signals through from the cable to an electronic device. Circuits 511 and 512 may be passive pass-through circuits, active retiming circuits, or other appropriate circuitry. In this example, plug interface circuitry 510 may include similar circuits 513 and 514. Circuits 516 and 517 may receive AC modulated control signals from circuits 526 and 527. Circuit 516 may convert an AC modulated control signal to generate an auxiliary signal. Similarly, plug interface circuitry 517 may generate a control signal.

Again, this unified connector may provide signals for different legacy interfaces. An example is shown in the following figure.

Figure 6:
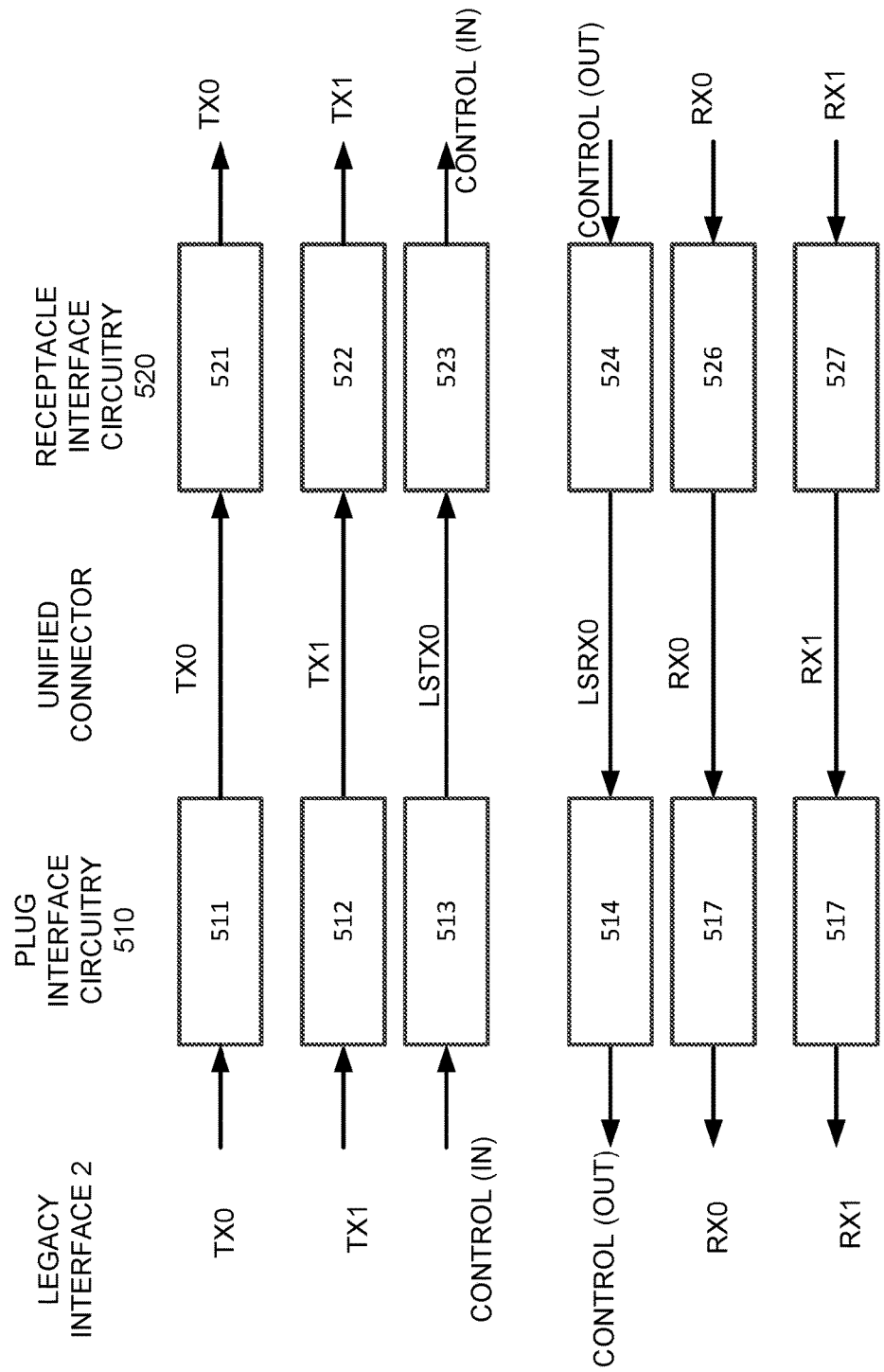
FIG. 6 illustrates the unified connector and circuitry of FIG. 5 conveying signals for a second legacy interface.

FIG. 6 illustrates the unified connector and circuitry of FIG. 5 conveying signals for a second legacy interface. As before, circuits 511 and 512 may receive transmit signals and pass them on to receptacle circuitry 520. Control lines may be received via provided by circuits 513 514. Circuit 513 may receive a control signal and modulate it into AC signal, which may pass through the AC coupling capacitors the present at the output of circuit 513. As before, circuit 514 may modulate AC signal to provide a control output. Circuits 516 and 517 may receive data signals and provide them on the conductors in the cable.

Again, control signals may be modulated into higher frequency AC signals such that they may pass through an AC coupling capacitor. This may allow a control signal and a transmit (or receive) signal to be mapped to a single pin (or pins) in a unified connector. This may eliminate the need for a multiplexer and does not significantly attenuate either signal. An example of this modulation is shown in the following figure.

Figure 7:
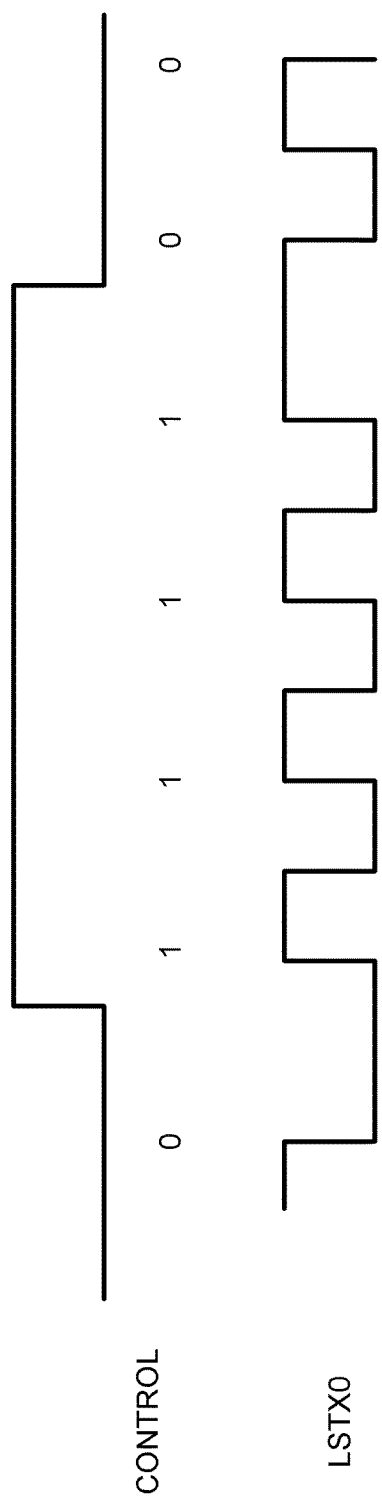
FIG. 7 illustrates a control signal being modulated to a DC-balanced AC signal that may pass through an AC-coupling capacitor according to embodiments of the present invention.

FIG. 7 illustrates a control signal being modulated to a DC-balanced AC signal that may pass through an AC-coupling capacitor according to embodiments of the present invention. In this example, a control signal is modulated into a low-speed transmit output signal. The low-speed transmit signal may be DC balanced. In may also have a relatively low swing. In various embodiments of the present invention, control signals may be single ended or differential, while the low-speed transmit output may be single ended or differential.

More specifically, a low-speed or near DC control signal may be converted into a different second signal, such as a higher-speed data signal that alternates between values of "0" and "1." The second signal may be transmitted from a first device to a second device. The second device may either read the second signal directly or convert the second signal back to a low-speed or near DC control signal.

In this in other embodiments of the present invention, the number of pins in a unified connector may be further reduced by combining two or more auxiliary or control signals. An example is shown in the following figure.

Figure 8:
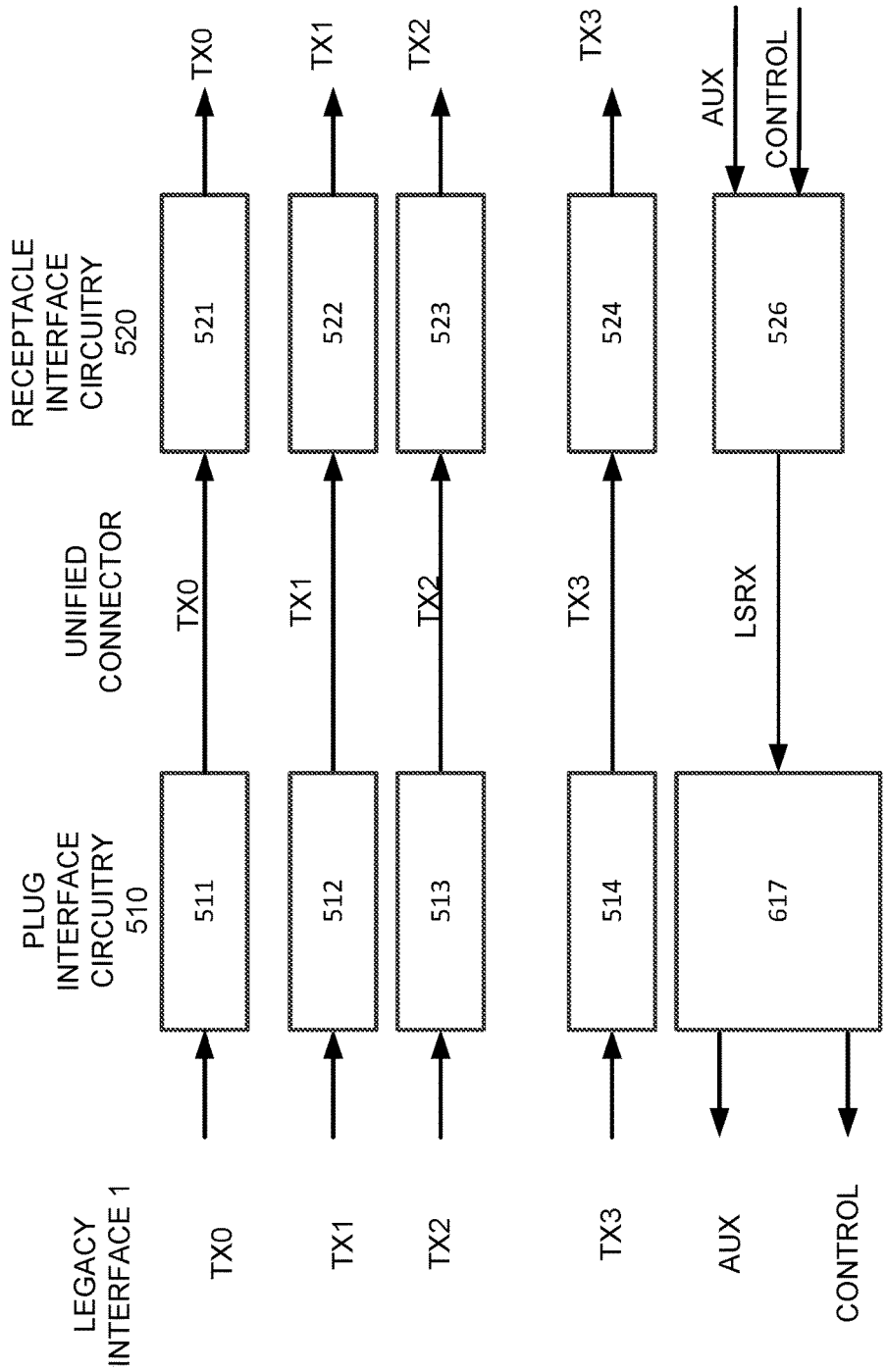
FIG. 8 illustrates a unified connector and circuitry according to an embodiment of the present invention.

FIG. 8 illustrates a unified connector and circuitry according to an embodiment of the present invention. In this figure, control and auxiliary signals are combined by circuitry 526 provided onto the unified connector where they are received by circuitry 616. Circuitry 616 may split the combined signal into its auxiliary and control components and provide them onto conductors in a cable.

In various embodiments the present invention, these auxiliary and control signals may be combined in various ways. For example, they may be combined by time-domain multiplexing. They may also be reduced to state information, and then passed to circuitry 616. An example is shown in the following figure.

Figure 9:
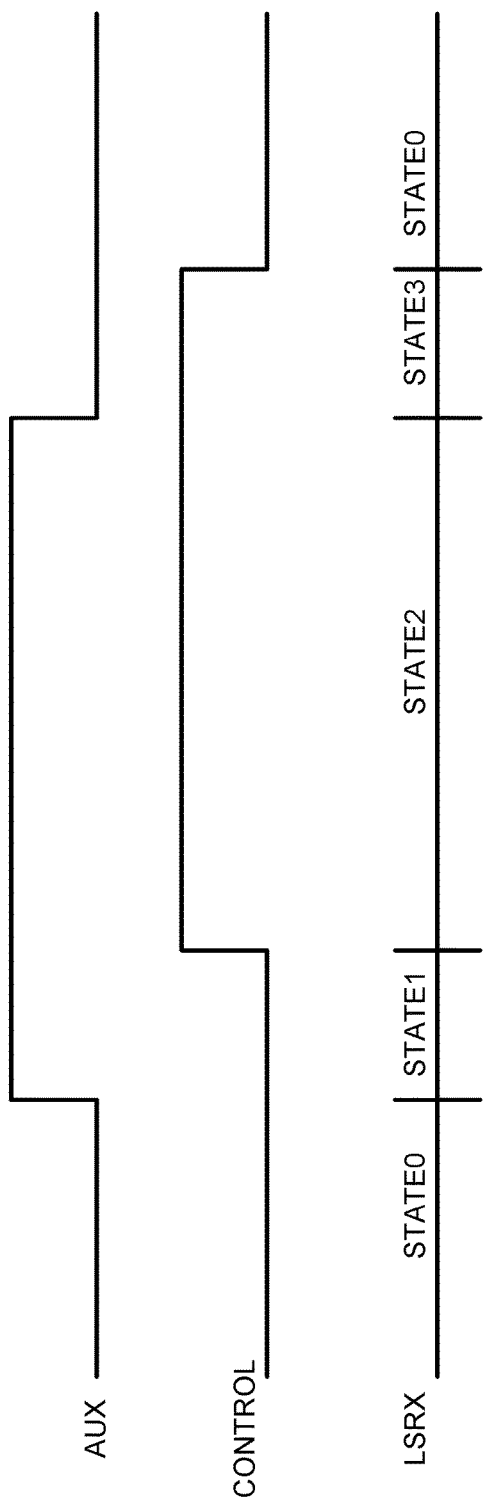
FIG. 9 illustrates a method of combining control signals according to an embodiment of the present invention.

FIG. 9 illustrates a method of combining control signals according to an embodiment of the present invention. In this example, auxiliary and control signals are reduced to states, and this state information may be transmitted across a unified connector and deconstructed on the other side. This state information may be conveyed as packets. The state information may be included as an AC signal, as shown above.

In other embodiments of the present invention, data signals may be effectively segregated from control signals. This may allow small signal AC-coupled signals to be transferred using a first set of pins in a unified connector, and a larger signal low-speed DC coupled control signals to be transferred on a second set of pins in the unified connector. An example is shown in the following figures.

FIG. 10 illustrates a signal mapping according to an embodiment of the present invention. Again in this example, a first legacy interface and a second legacy interface are mapped onto a unified interface. As before, transmit signals in a first legacy interface and transmit signals in a second legacy interface may be mapped to transmit signals in the unified interface. Also, transmit signals in the first legacy interface may be mapped onto received pins of the second legacy interface. Accordingly, there may be pins in the unified connector that are transmit pins or received pins depending on which legacy interfaces be employed. In this example, control and auxiliary pins in the first legacy interface are mapped to control and pins in the second legacy interface.

Figure 11:
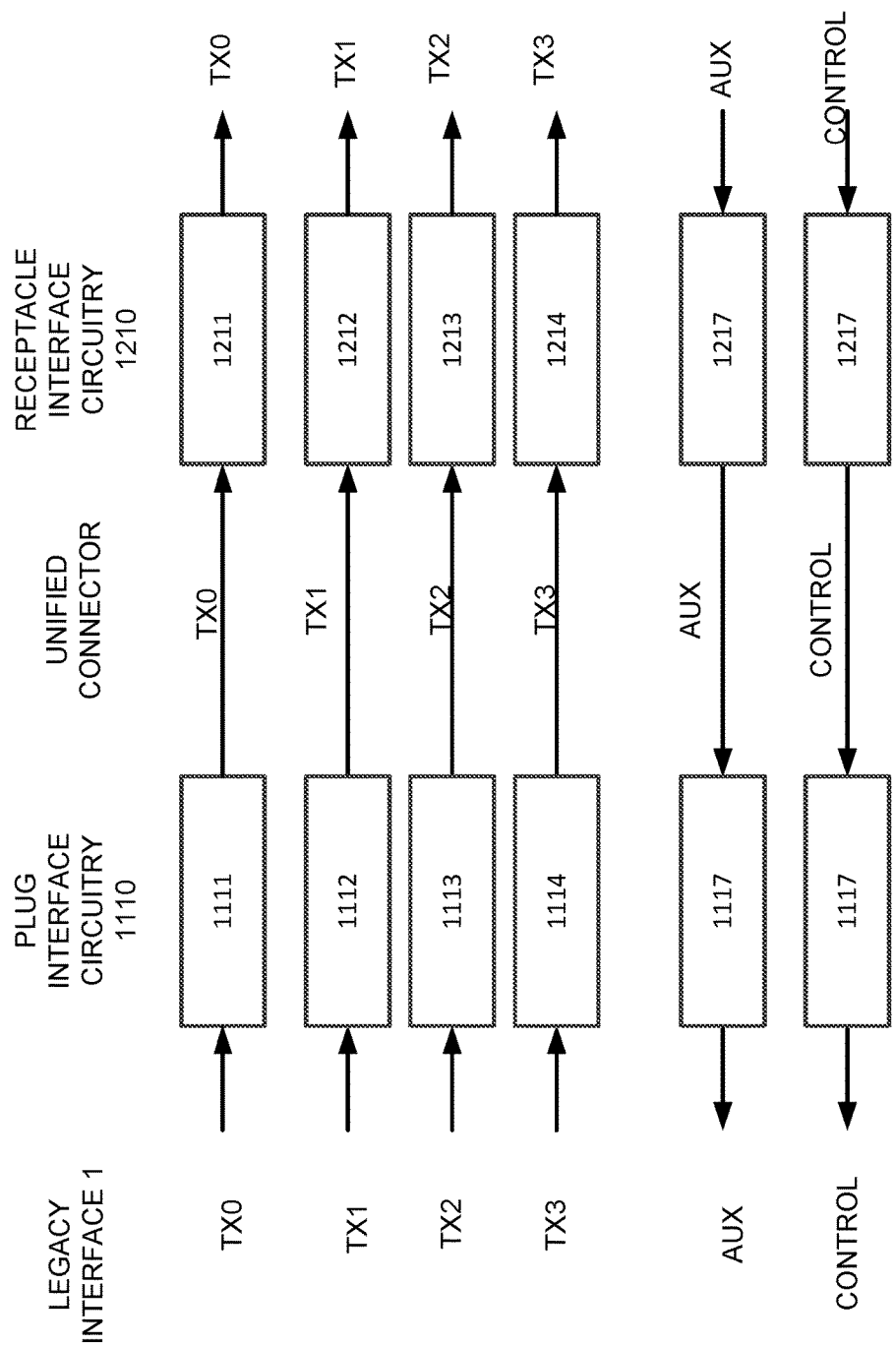
FIG. 11 illustrates a unified connector and associated circuitry according to an embodiment of the present invention.

FIG. 11 illustrates a unified connector and associated circuitry according to an embodiment of the present invention. This figure illustrates signals from a first legacy interface. Again, these signals may be conveyed on a cable, such as cable 230 or dongle 240. Plug interface circuitry 1110 may be located in a plug such as plug 232. A unified connector may provide signals to a receptacle and receptacle interface circuitry 1120. In this example, circuits 1111, 1112, 1113, and 1114 may simply pass transmit signals, or they may retime the signals. Similarly, circuits 1116 and 1117 may simply pass control lines signals.

Figure 12:
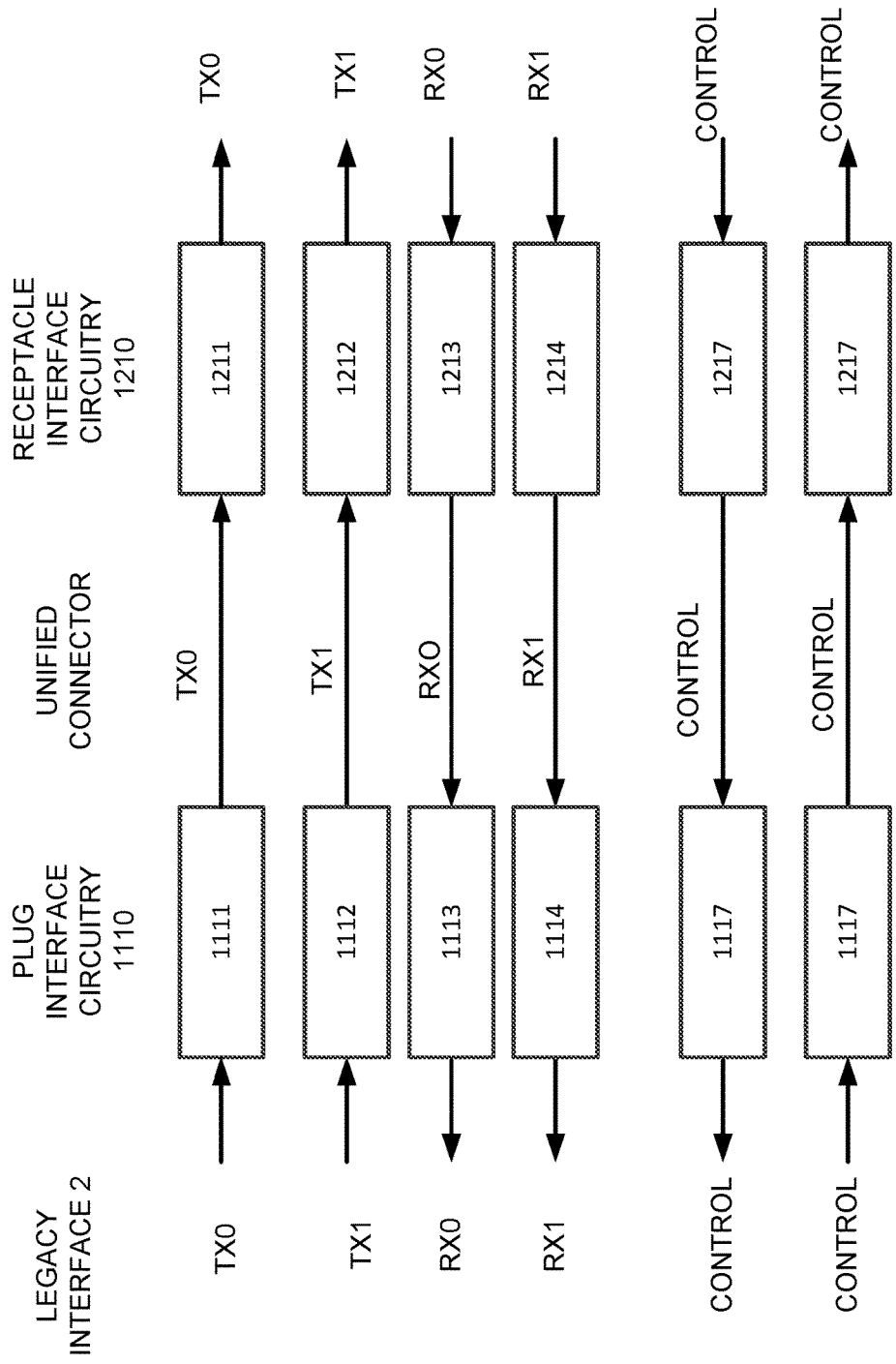
FIG. 12 illustrates a unified connector and associated circuitry according to an embodiment of the present invention.

FIG. 12 illustrates a unified connector and associated circuitry according to an embodiment of the present invention. In this figure, signals from a second legacy interface are received by plug interface circuitry 1110. As before, circuits 1111 and 1112 may pass transmit signals through. In this example though, circuits 1113 and 1114, which had provided transmit signals to receptacle interface circuit 1220, now provide received signals from receptacle interface circuits 1213 and 1214 to conductors in the cable. Similarly plug circuit 1117, which had received a control signal from receptacle interface circuit 1220, now provides a control signal to receptacle interface circuit 1217.

In other embodiments the present invention, the number of pins needed at a unified connector may be further reduced. In one example, multiple transmit, receive, or control signals may be combined and transmitted as a single signal. An example is shown in the following figure.

FIG. 13 illustrates a signal mapping according to an embodiment of the present invention. In this example, signals of a first legacy interface and a second legacy interface are mapped on to a unified interface. As before, two transmit signals may be provided in both legacy interfaces. Accordingly, the transmit signals in each legacy interface may be combined and provided as a single signal in the unified interface. For example, when the first legacy interface is used, the transmit signals may be combined and provided as transmit signal TXO1 on pins of a unified connector. Similarly, the receive signals of the second legacy interface may be combined and provided as a single signal at the unified interface. This combining may applied to control signals as well, as shown above.

In various embodiments of the present invention, this combining may be performed in various ways, such as by using interleaving or other techniques.

Figure 14:
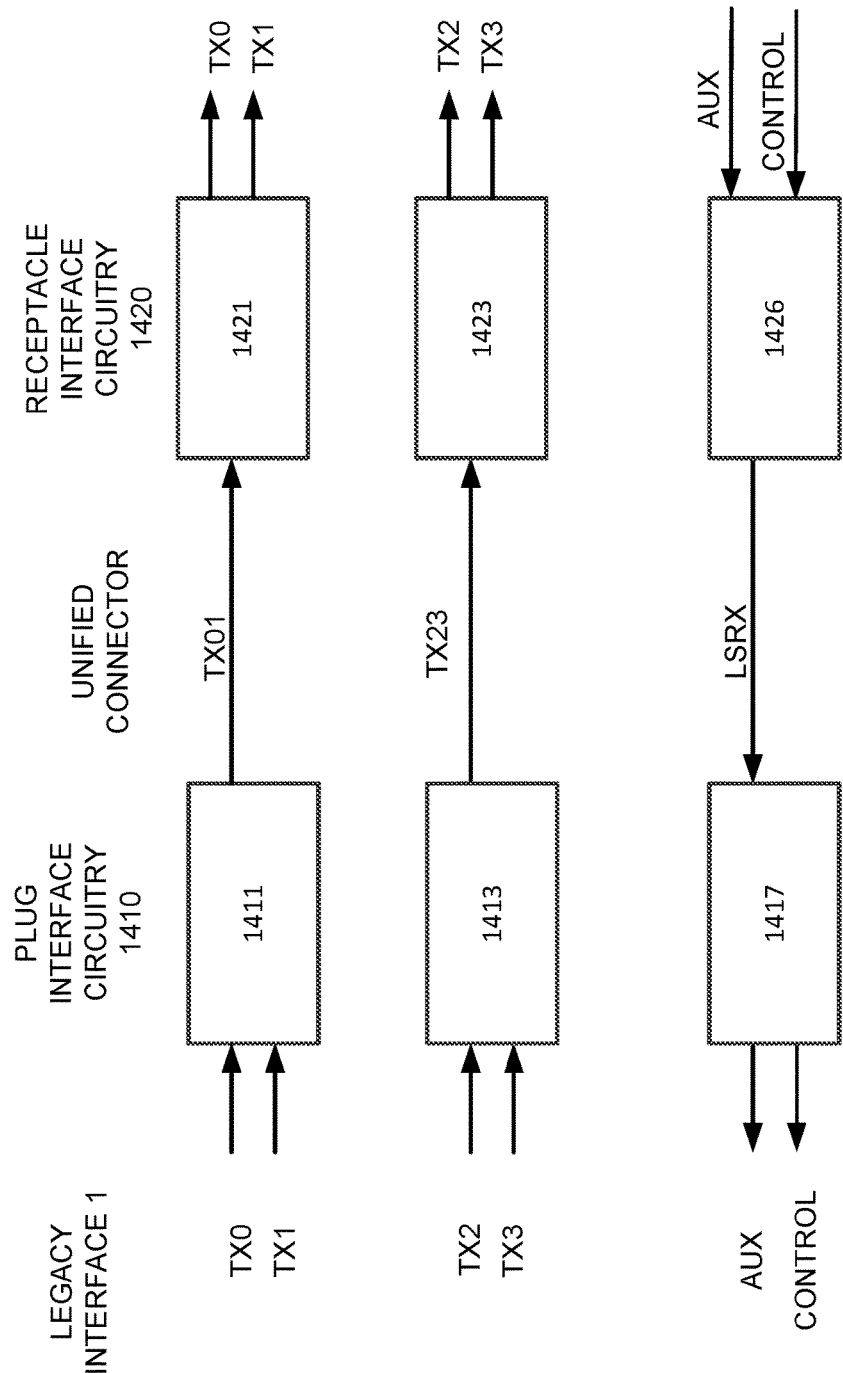
FIG. 14 illustrates a unified connector and associated circuitry according to an embodiment of the present invention.

FIG. 14 illustrates a unified connector and associated circuitry according to an embodiment of the present invention. In this example, a first legacy interface is received at a plug of a cable. The first legacy interface signals may be received by conductors on a cable, such as cable 230 or dongle 240. Two transmit signals may be received by circuit 1411, combined as a single signal across the front connector. Similarly auxiliary and control signals may be received by circuit 1426 and combined and provided as a single signal across the unified connector. The single signal may be deconstructed by circuit 1416 and provided as legacy interface control and auxiliary lines.

Figure 15:
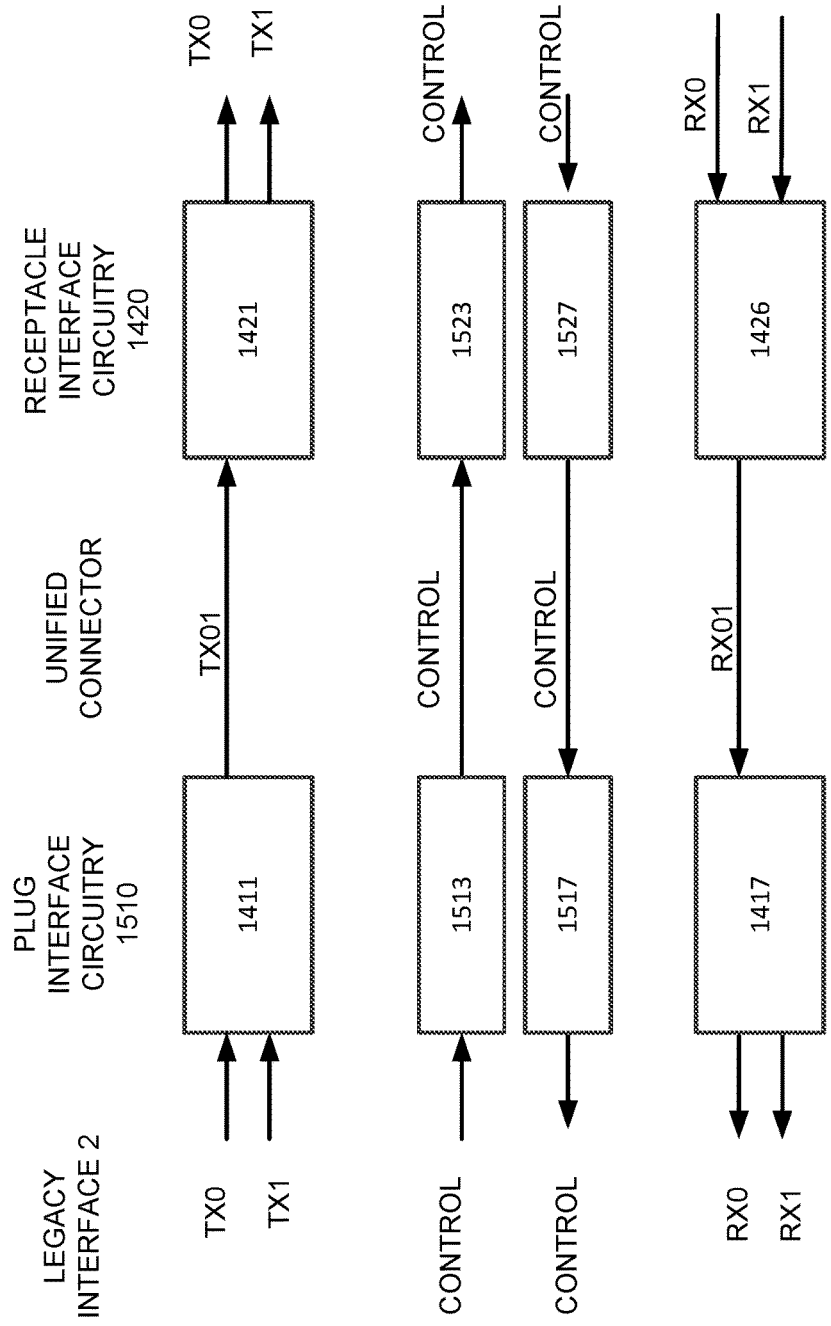
FIG. 15 illustrates a unified connector and associated circuitry according to an embodiment of the present invention.

FIG. 15 illustrates a unified connector and associated circuitry according to an embodiment of the present invention. In this example, two receive signals are received by circuitry 1426 and provided as a single received signal on the unified connector. Circuitry 1416 may receive the single signal and deconstruct it into two receive signals for the second legacy interface.

Again, embodiments of the present invention may provide cables that are reversible. That is, a cable having a first plug inserted into a receptacle in a first device and a second plug inserted into a receptacle of a second device may be reversed such that the first plug is inserted into the receptacle of a second device and the second plug is inserted into a receptacle of a first device, where functionality is maintained in both configurations. Providing a cable that is reversible may require the addition of various circuits in the cable and its connector inserts. This circuitry may be located in plugs or insert portions of a cable, in the cable itself, or at other portions of the cable. An example is shown in the following figures.

Figure 16:
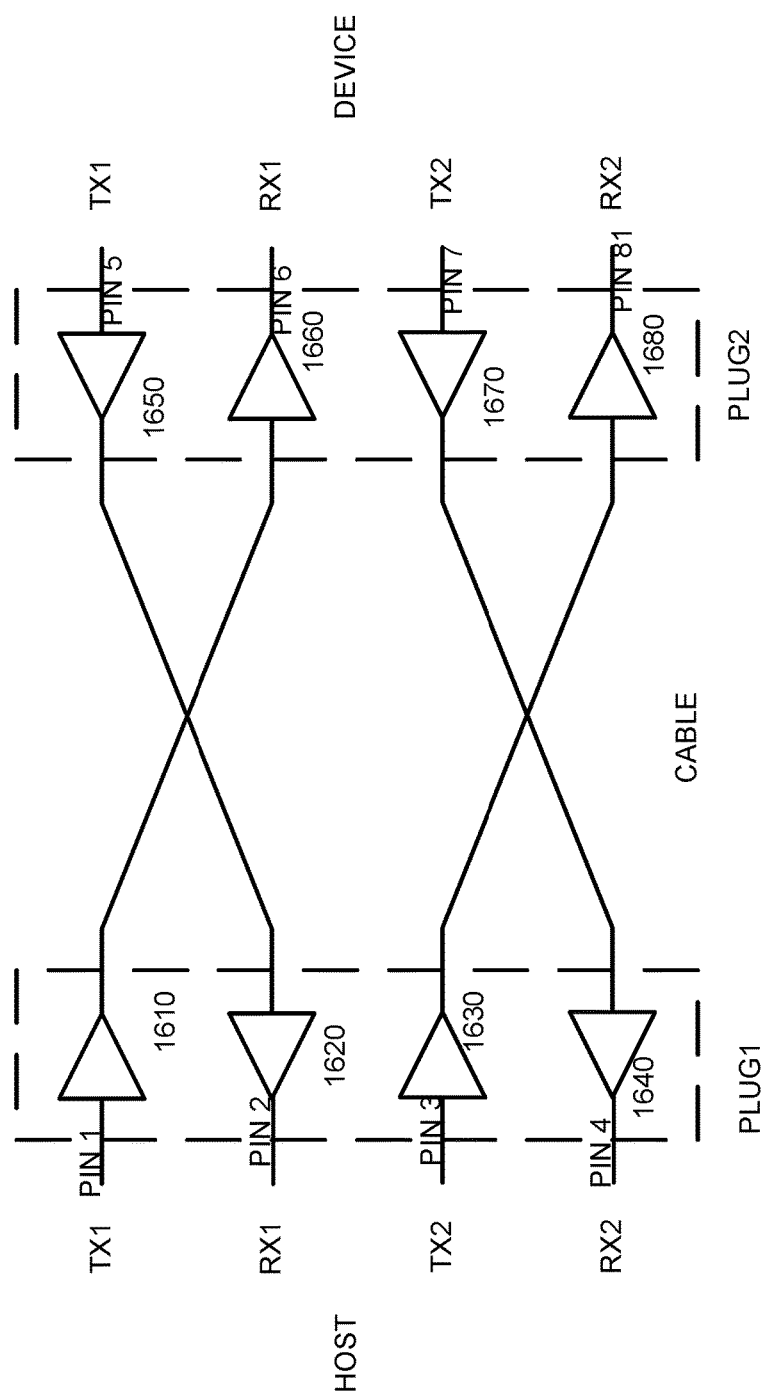
FIG. 16 illustrates circuitry for a cable according to an embodiment of the present invention.

FIG. 16 illustrates circuitry for a cable according to an embodiment of the present invention. In this example, a host may transmit data to a device over two transmit paths, while the device may transmit data to the host over two transmit paths. Specifically, a host may transmit data using circuits 1610 and 1630 in plug 1 and receive circuits 1660 and 1680 in plug 2. Similarly, the host may receive data from the device using receivers 1620 and 1640 in pug 1, which may be driven by transmit circuits 1650 and 1670 in plug 2.

In this configuration, the cable may be reversible. That is, plug 2 may be disconnected from the host and plugged into the device, while plug 2 may be disconnected from the device and plugged into the host. In these embodiments of the present invention, functionality may be maintained in either configuration.

Again, the cable shown may be configurable to provide signals consistent with other protocols. An example is shown in the following figure.

Figure 17:
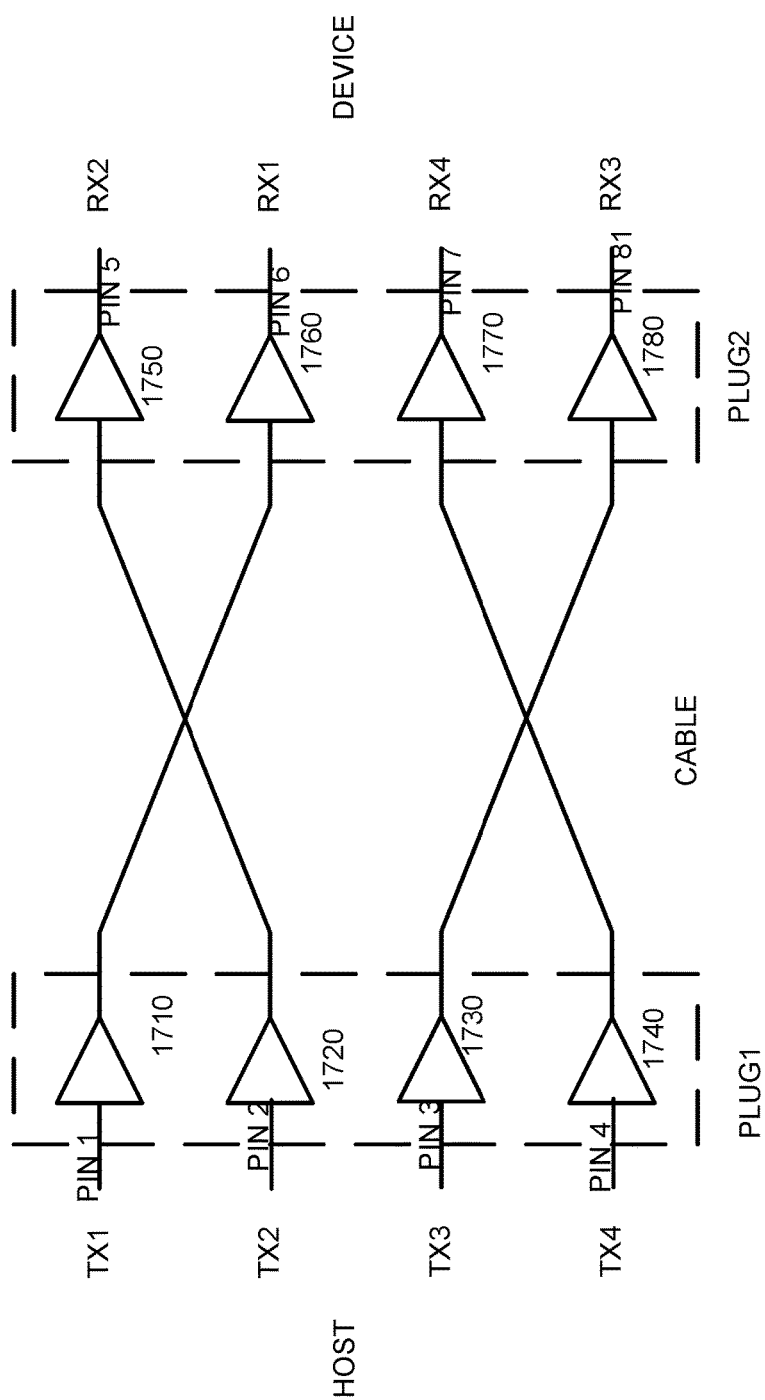
FIG. 17 illustrates circuitry for a cable according to an embodiment of the present invention.

FIG. 17 illustrates circuitry for a cable according to an embodiment of the present invention. In this example, a host may provide data to a device over four paths. For example, host may transmit data to the device using circuits and 1710, 1720, 1730, and 1740 in plug 1, which may transmit data to receivers 1750, 1760, 1770, and 1780 in plug 2. Without more, this cable is not reversible. Specifically, when plug 2 is removed from the device and inserted into the host, while plug 1 is removed from the host and inserted into the device, the host may no longer be able to transmit data to the device. To compensate for this, additional circuitry may be included in plug 1 and plug 2. An example is shown in the following figure.

Figure 18:
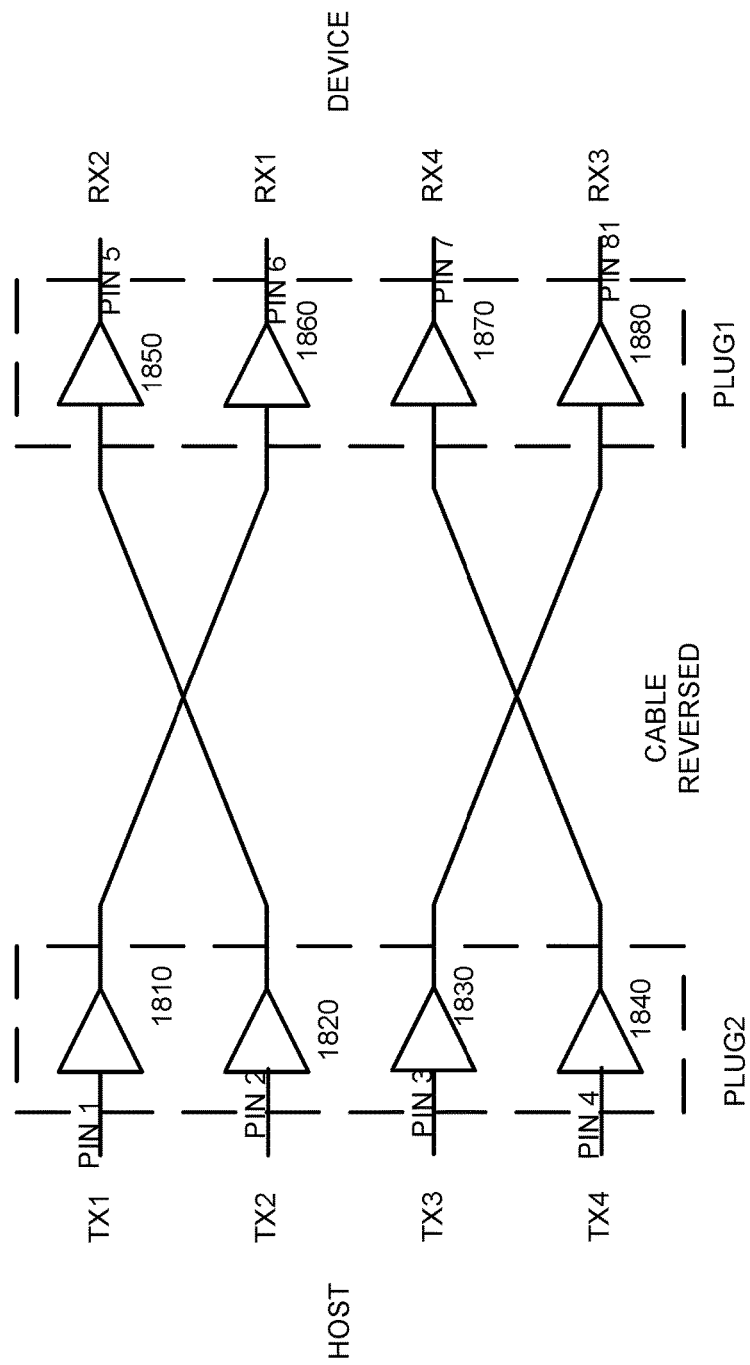
FIG. 18 illustrates circuitry for cable according to an embodiment of the present invention.

FIG. 18 illustrates circuitry for cable according to an embodiment of the present invention. In this figure, additional circuitry in plug 2 is activated such that the host may transmit data to plug 1, where it may be received via additional circuitry in that plug. Specifically, the host may transmit data using drivers 1810, 1820, 1830, in 1840 in plug 2, which may be received by receivers 1850, 1860, 1870, in 1880 in plug 1.

Circuitry that may allow either of the above configurations to the possible using a reversible cable is shown in the following figure.

Figure 19:
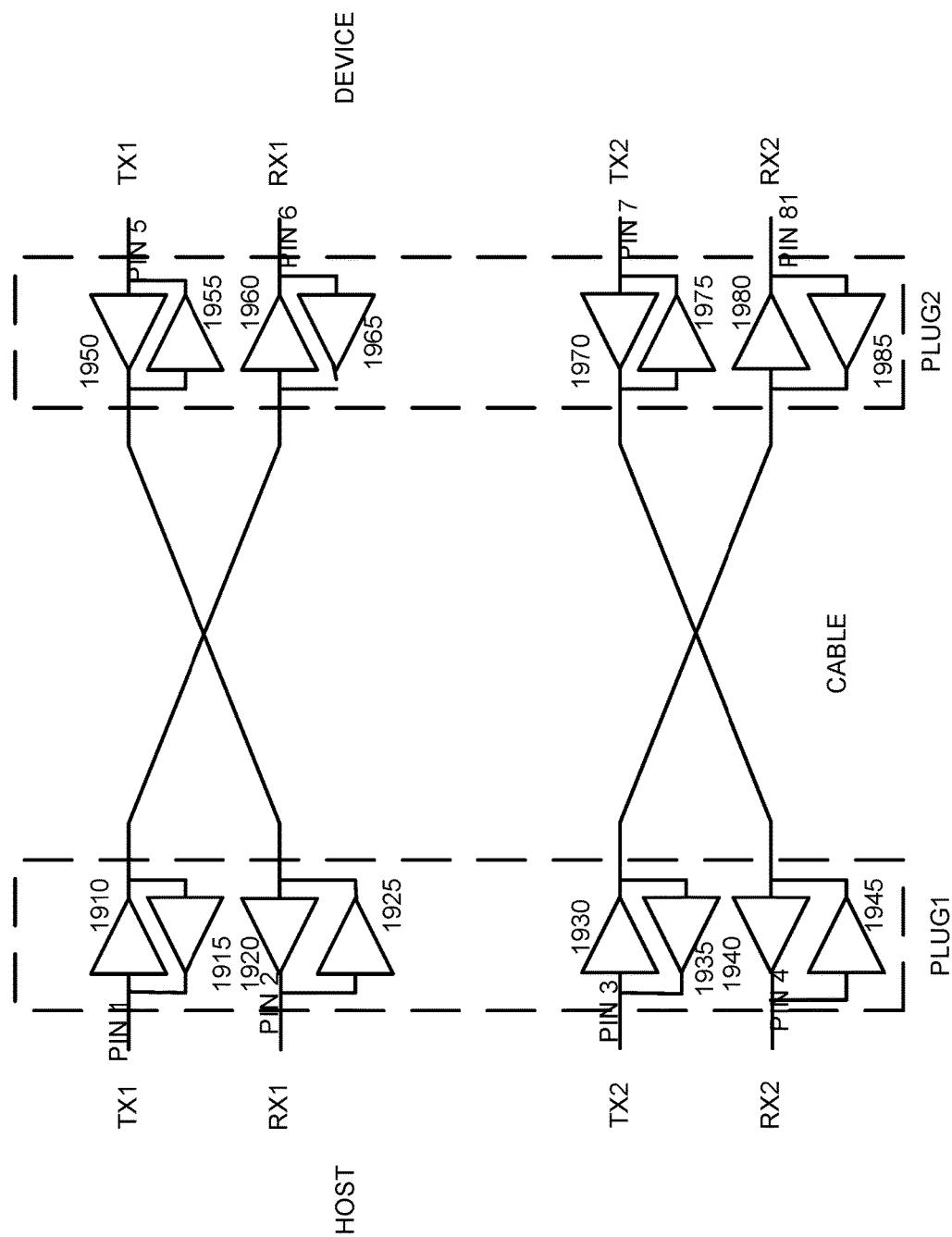
FIG. 19 illustrates circuitry for cable according to an embodiment of the present invention.

FIG. 19 illustrates circuitry for cable according to an embodiment of the present invention. In this example, circuitry in the cable plugs may be configured in a number of ways. For example, the host may communicate with a device over two transmit channels and two receive channels as before. This cable is also reversible such that if plug 2 is inserted into the host and plug 1 is inserted into the device, the host may still communicate with a device using two transmit and two receive paths.

Also, the host may transmit data to the device using four transmit paths. This cable may be reversible while still providing four transmit paths between the host and device.

Specifically, in one configuration, the host may transmit data to the device using transmit circuits 1910 and 1930 in plug 1 and receive circuits 1960 and 1980 in plug 2, while the host may receive data from the device using receivers 1920 and 1940 in plug 1, and transmitters 1950 and 1970 in plug 2. As in the above example, this cable may be reversible.

Also, the host may transmit data to the device using transmitters 1910, 1925, 1930, and 1945 in plug 1 and receivers 1955 1960, 1975, and 1980 in plug 2. As before, this cable may be reversible. That is, plug 2 may be inserted into the host, while plug 1 may be inserted into the device. In that case, the host may transmit data to the device using transmitters 1950, 1965, 1970, and 1985 in plug 2, and receivers 1915, 1920, 1935, and 1940 in plug 1.

The idea reversibility may arise in a slightly different context. For example, a host or device may have a unified connector, while accessory may have a legacy connector. A user may use a cable having a unified connector at a first end and a legacy connector at a second end to facilitate communication between the host and accessory. At a different time, the same user may have a host having a legacy connector and accessory having a unified connector. Since the cable is reversible, the user may use a cable according to an embodiment of the present invention in both systems while maintaining functionality.

In this and the other examples, different protocols may require that the transmit and receive circuits in the plugs operate at different speeds. For this reason, some circuitry attached to an individual pin may include a very high-speed receiver and a more moderately speed transmitter, while others may include a very high-speed transmitter and a more moderately speed receiver. To increase the speed of data in a cable, the various transmitters and receivers may employ various signaling techniques. For example, modulation schemes, such as PAM 4 or other modulation schemes may be used by transmitters and receivers in host, device, and cable plug circuits in various embodiments of the present invention.

Also, pin numbers are shown in the above figures. These are to show consistency between configurations and are not indicative of any particular pinout. That is, pin 1 of plug 1 is the same pin 1 of plug 1 for each of the FIGS. 16-19.

Again, embodiments of the present invention may facilitate communication between devices by providing multiple protocols over a unified connector and cable. An example is shown in the following figure.

Figure 20:
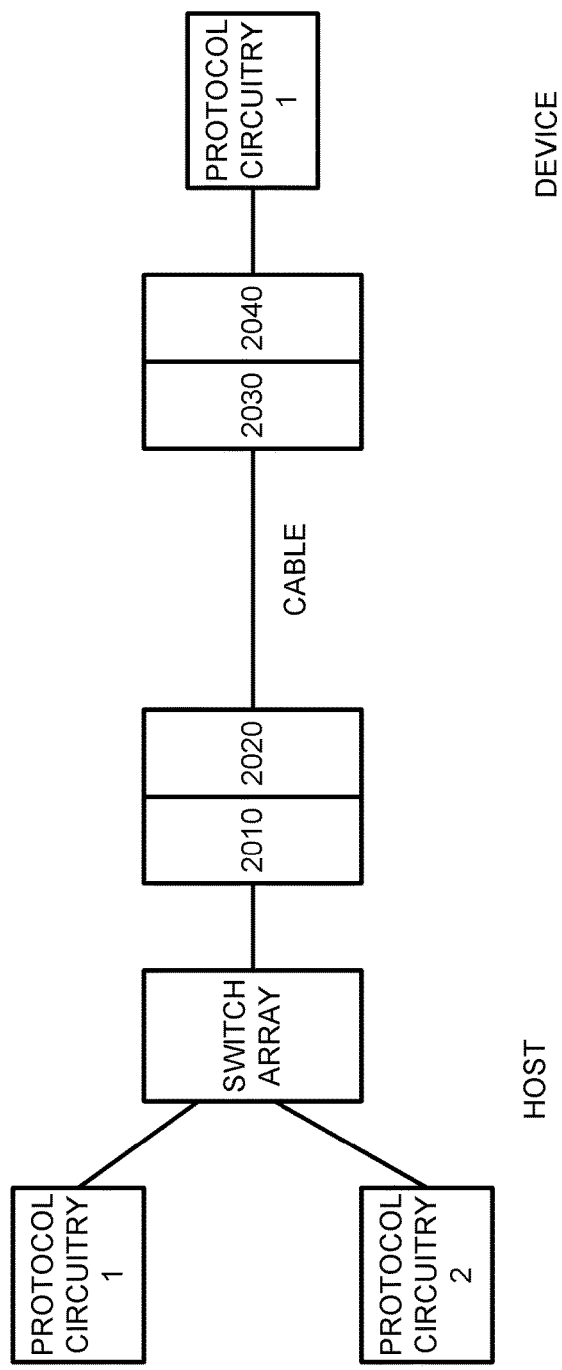
FIG. 20 illustrates an electronic system according to an embodiment of the present invention.

FIG. 20 illustrates an electronic system according to an embodiment of the present invention. This figure includes a host having a connector receptacle 110, first protocol circuitry, second protocol circuitry, and an array. The array may communicate with both a first and second protocol. The array may select between one of the first and second protocols and provide corresponding signals to receptacle to 10. Unified connector 2020 may be inserted into receptacle 2010. The far end of the cable, connector insert to 30 may be inserted into a legacy receptacle 240 in a device. The device may include circuitry for only a first protocol. In this way, a user may attach a device having a receptacle compatible with a first legacy protocol to a host having a unified connector.

The host may include further circuitry (not shown) for determining which protocol should be selected and for configuring the array. This may be done by reading one or more registers, which may be located in either or both of plugs 2020 and 2030. Reading of these registers may be done in other embodiments of the present invention as well.

In various embodiments of the present invention, the array may be formed using various types of circuits, such as FETs or other transistors, micro-electronic machines (MEMs), relays, or other types of switches.

While in this embodiment of the present invention, a host having a unified connector may communicate with a device having a legacy connector, in other embodiments of the present invention, a device having a unified connector may communicate with a host having a legacy connector, or a host and device each having a unified connector may indicate with each other. An example is shown in the following figure.

Figure 21:
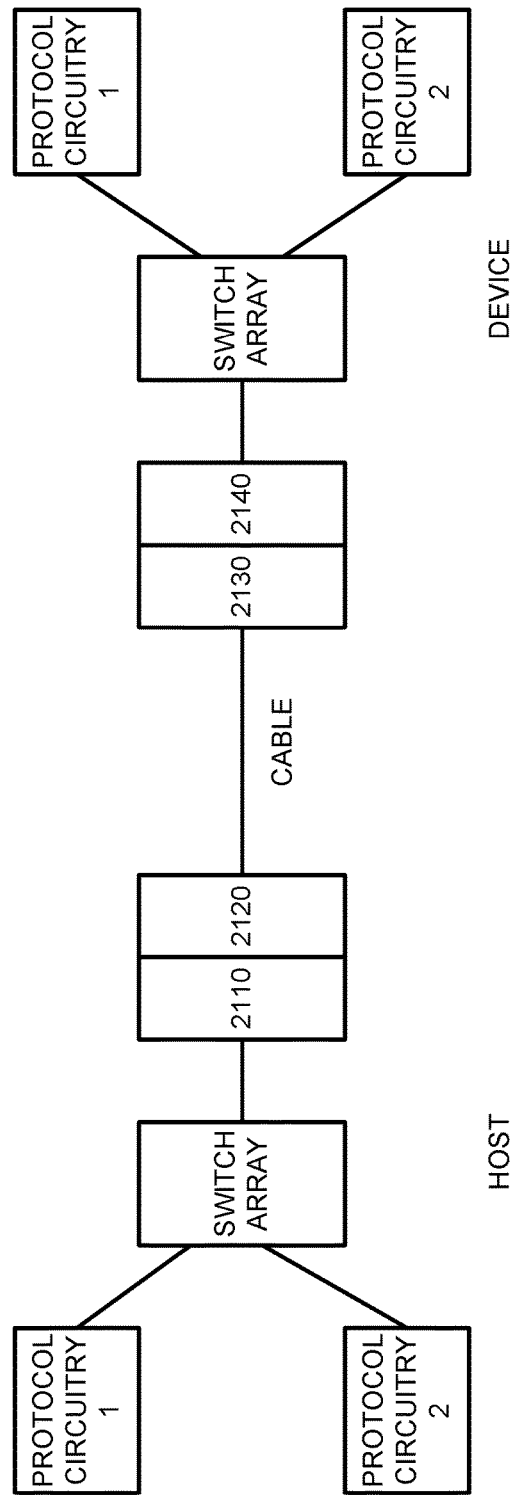
FIG. 21 illustrates an electronic system according to an embodiment of the present invention.

FIG. 21 illustrates an electronic system according to an embodiment of the present invention. In this example, an array in a host may selectively communicate with either a first protocol or a second protocol. The array may provide and receive signals over connector receptacle 2110. Similarly, a device may communicate using either a first or second protocol via an array and receptacle 2140. A cable having plugs 2120 and 2030 on each and may facilitate communications between host and device.

In some embodiments of the present invention, a unified connector may communicate with a legacy device, where the legacy device, or its connector, may need a higher voltage than would ordinarily be provided by the unified connector and its associated circuitry. In such an example, a power boosting circuitry may be included in a plug of a cable connected to a unified connector. An example is shown in the following figure.

Figure 22:
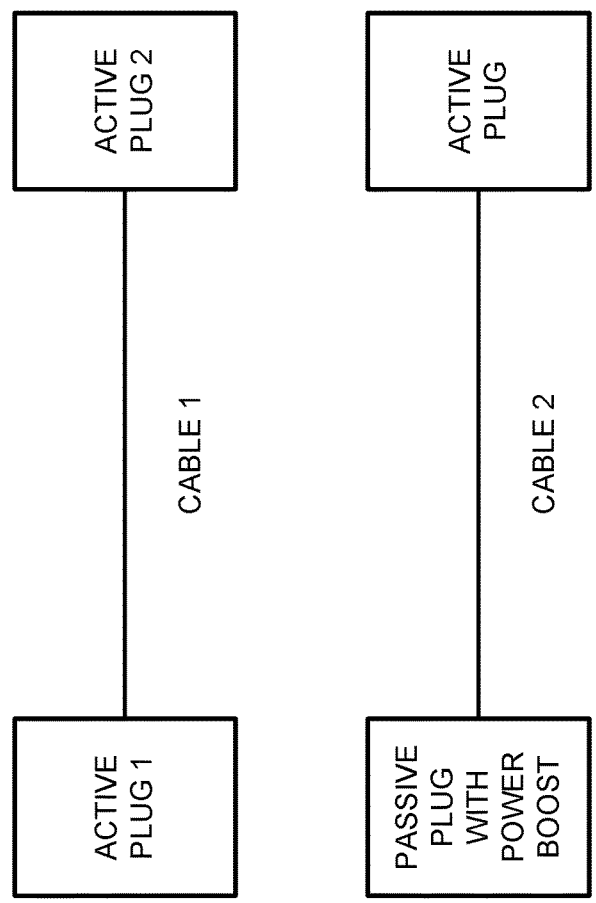
FIG. 22 illustrates cables according to an embodiment of the present invention.

FIG. 22 illustrates cables according to an embodiment of the present invention. A first cable, cable 1, may include active plugs on each end. In certain situations, one of these plugs may need to provide a higher voltage to the other. Accordingly, a power boost circuit may be included in a plug of cable 2.

This power boost circuit may consume space and dissipate heat in its plug. To compensate for this, active circuitry in the plug may be removed or power down. This may be possible by relying upon the performance of the retiming circuitry in the distant plug, as well as retiming circuitry associated with a receptacle mated with the plug with power boost. The inclusion of the power boost circuits may be further facilitated by ensuring that cable to is kept short enough that the active circuitry that would otherwise be present is not needed.

In various embodiments of the present invention, it may be desirable to reduce a number of contacts necessary in a connector, and to reduce a number of conductors in a cable. In one embodiment of the present invention, a low-speed DC coupled signal path may be combined with a high-speed AC coupled data path. In still other embodiments of the present invention, two or more low-speed data paths may be combined into a single low-speed data path. Examples are shown in the following figure.

Figure 23:
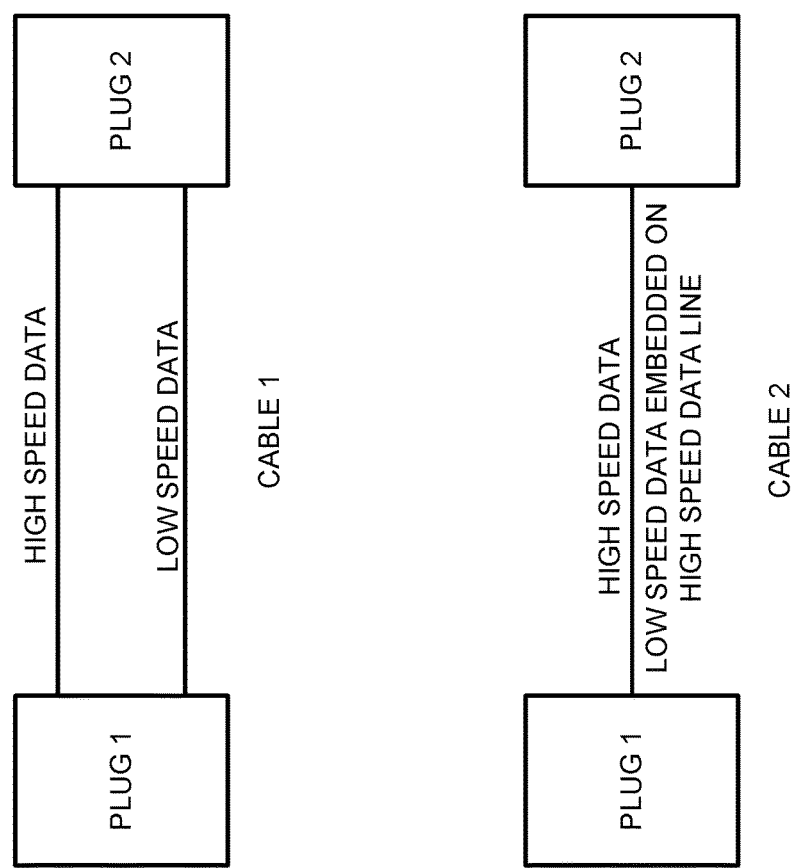
FIG. 23 illustrates a first cable that may have a high-speed data path and a low-speed data path between a first plug second plug.

FIG. 23 illustrates a first cable that may have a high-speed data path and a low-speed data path between a first plug second plug. A low-speed data path may be eliminated and combined with a high-speed data path in a second cable, cable 2. This may be done by modulating load speed data, as described above. This provides an additional advantage in that a low-speed data path that is DC coupled may be difficult to receive between devices where large ground drops are present. Again, in other embodiments of the present invention, multiple low-speed data lines are combined into a single low-speed data line in cable 1.

Various embodiments of the present invention may employ different techniques for use by a connector receptacle in determining an orientation and identification of a connector insert received by the connector receptacle. In various embodiments of the present invention, various signal pins, such as USB pins, may be used in determining this information. In other embodiments of the present invention, dedicated pins, such as the RFU pins in FIG. 26, may be used in determining a connector orientation. An example is shown in the following figure.

Figure 24:
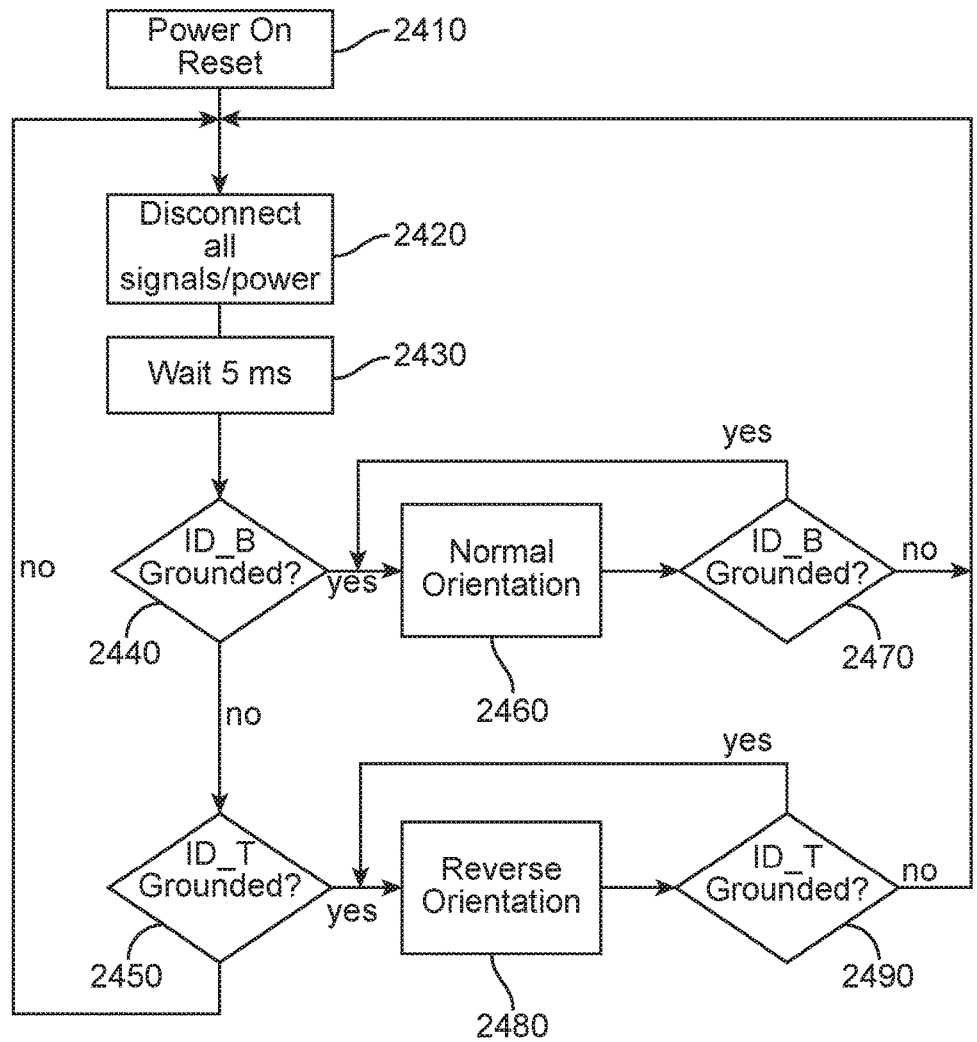
FIG. 24 illustrates a method of determining an orientation of a connector insert in a connector receptacle according to an embodiment of the present invention.

FIG. 24 illustrates a method of determining an orientation of a connector insert in a connector receptacle according to an embodiment of the present invention. In act 2410, a power on reset may occur. This may be caused by a device housing the receptacle powering up, or it may be caused by a restart or reboot of the device, or other similar event. In act 2420, signal and power may be disconnected at the receptacle pins. After a wait time, for example five milliseconds, in act 2430, it may be determined in act 2440 whether a first pin is grounded. This first pin may be an RFU pin on a bottom row of contacts in FIG. 42, or other similar pin. If the first pin is grounded, the receptacle may determine that the connector insert is inserted in a normal orientation. If it is determined later in act 2470 that the first pin is no longer grounded, the process may begin again. If it is determined in act 2440 that the first pin is not grounded, the receptacle may determine whether a second pin is grounded. This second pin may be an RFU pin in the top row of pins of the connector in FIG. 42, or other similar pin. If it is determined that the second pin is grounded, the connector may determine that the connector insert is inserted in a reversed orientation in act 2480. Again, if it is determined that this pin is no longer grounded in act 2490, the process may begin again at act 2420.

In this specific example, the receptacle may determine whether pins are grounded by providing current or voltage pulses—as opposed to providing a steady DC current. This may prevent dendritic growth on the pins. Also, since two pins may be checked but only one grounded, the remaining non-grounded pin may be used as a power supply, control signal, data signal, bias line, or other type of supply or signal pin. For example, a power supply for a remote device or accessory may be provided or received over the second pin. In one embodiment, a host may provide a power supply one the second, non-grounded pin while a second device or accessory may receive the power supply at a corresponding pin.

Figure 42:
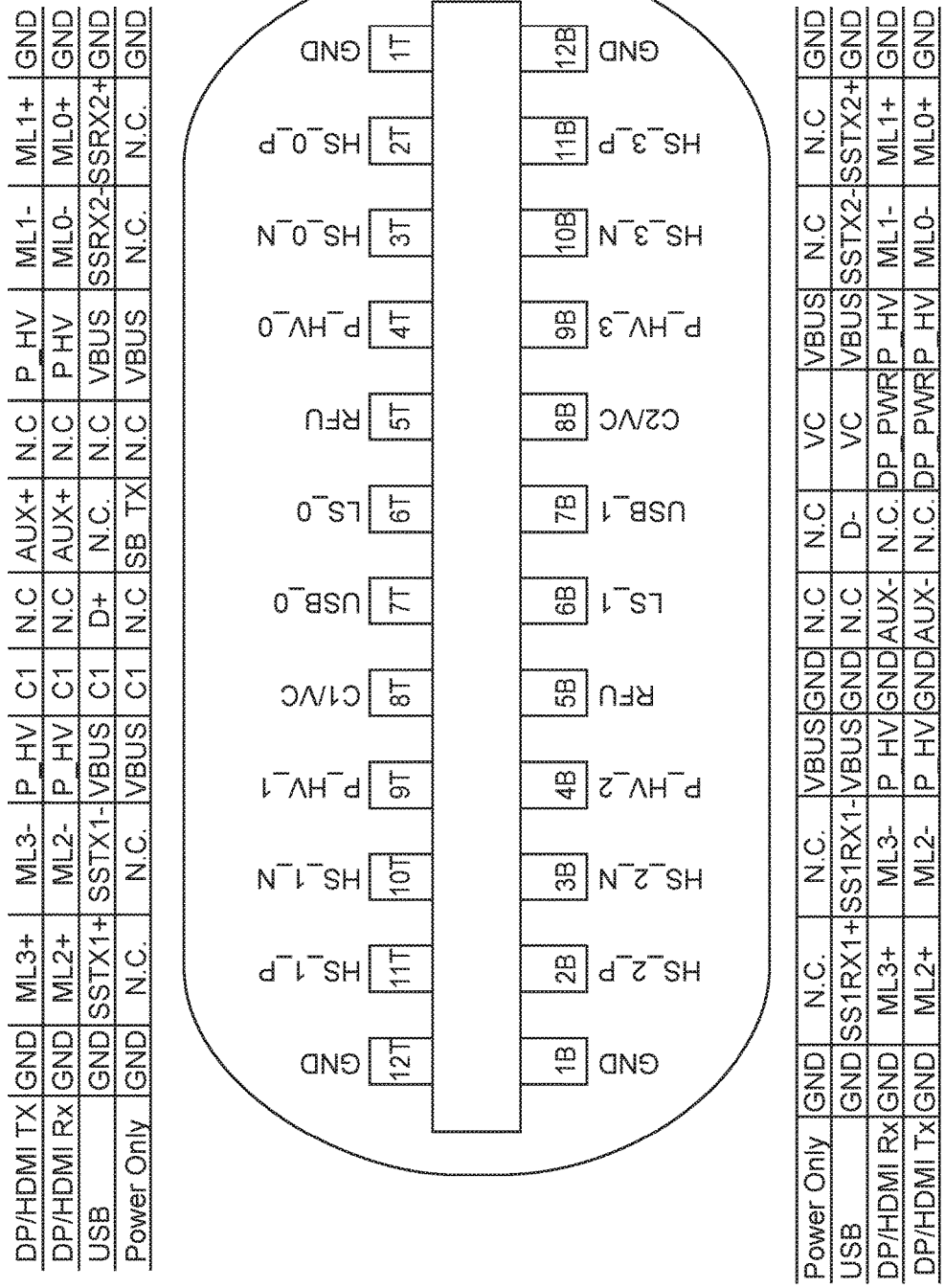
FIG. 42 illustrates a mapping of pins for various types of interfaces to pins of a connector receptacle according to an embodiment of the present invention.
Figure 43:
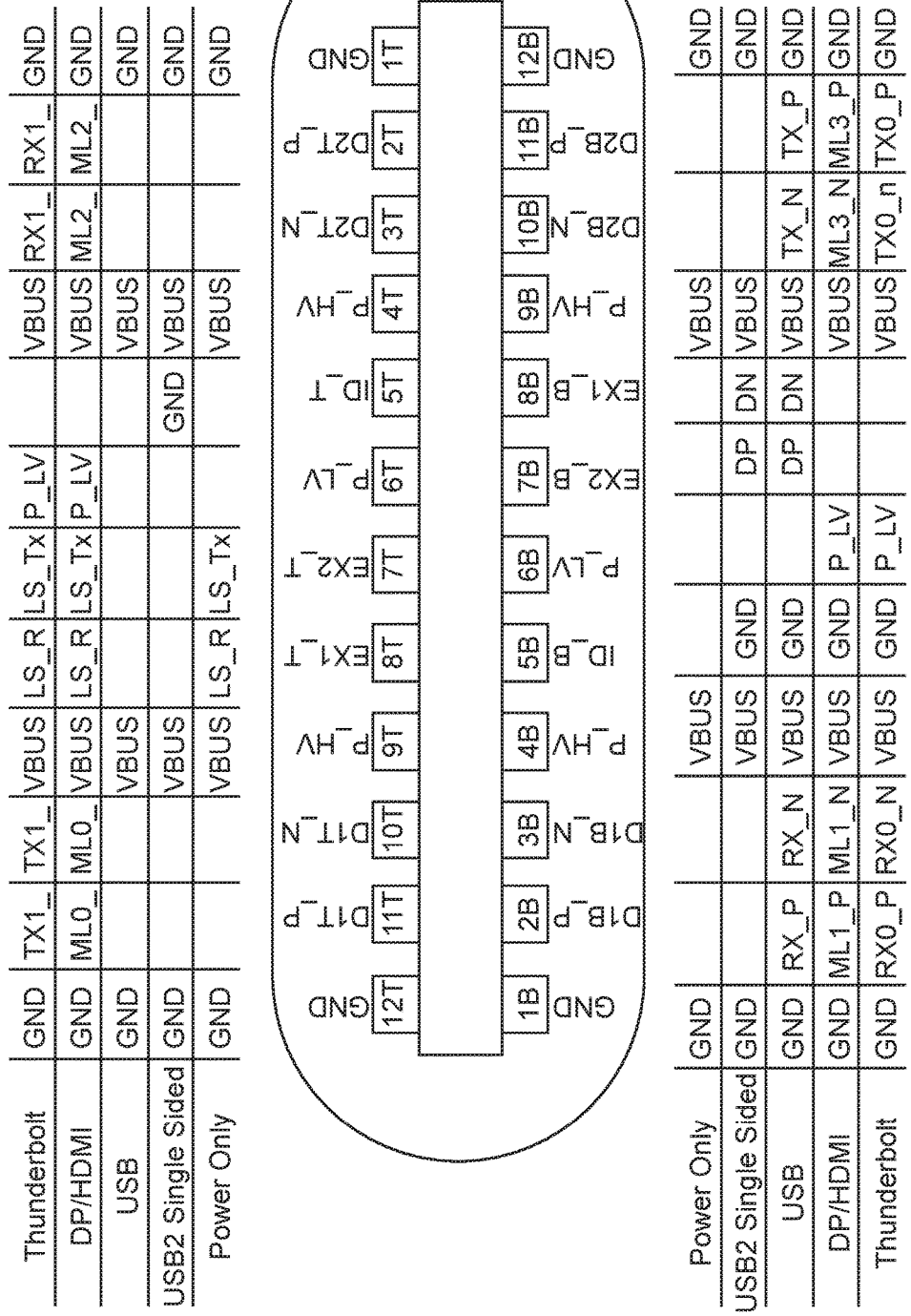
FIG. 43 illustrates a mapping of pins for various types of interfaces to pins of a connector receptacle according to an embodiment of the present invention.

Electronic devices employing receptacles provided by embodiments of the present invention, such as the receptacle in FIG. 42 or 43 or similar receptacles, may communicate with other types of devices over cable assemblies. These cable assemblies may include connector plugs or inserts at each end of a cable. Examples are shown in the following figures.

Figure 25:
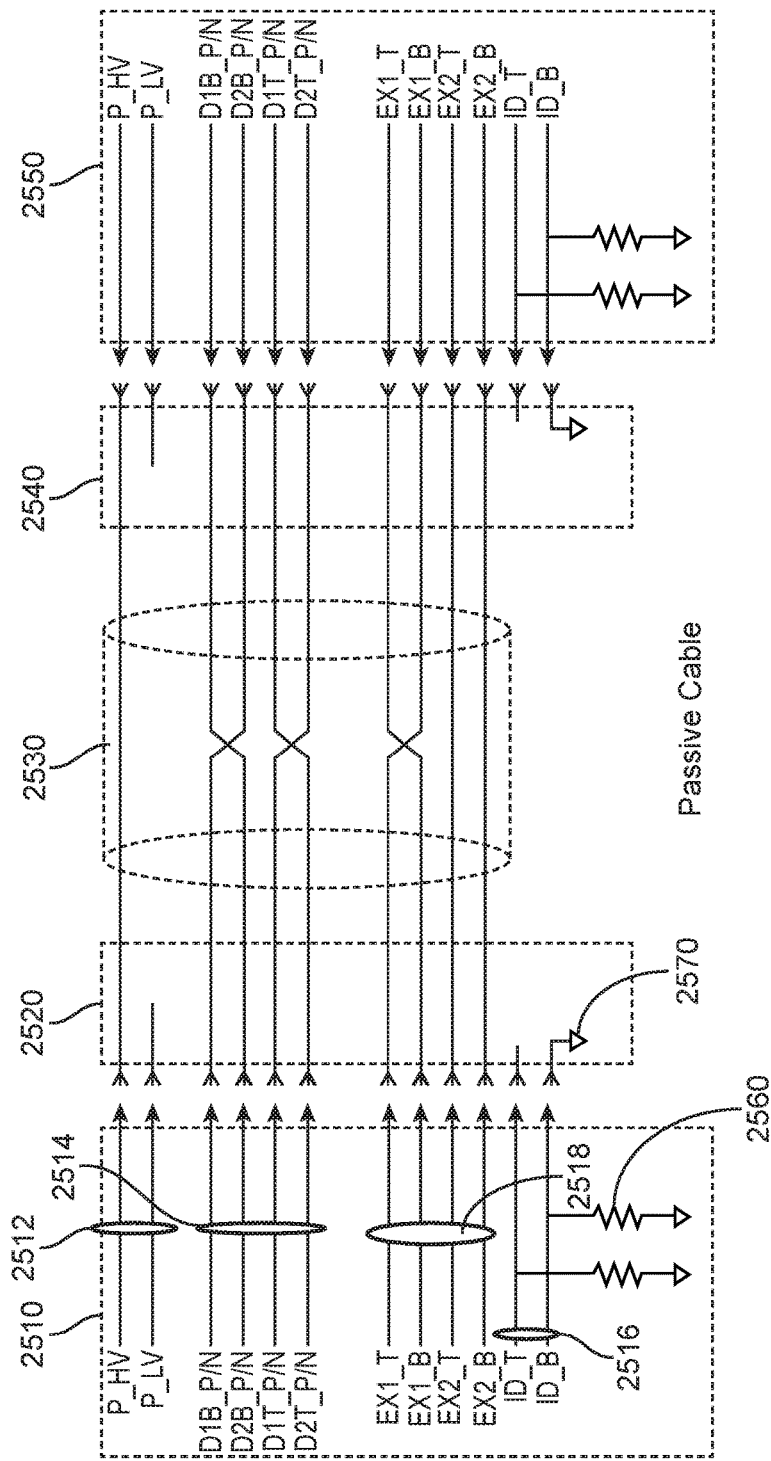
FIG. 25 illustrates two devices communicating over a passive cable according to an embodiment of the present invention.

FIG. 25 illustrates two devices communicating over a passive cable according to an embodiment of the present invention. In this example, a first receptacle 2510 in a first electronic device may communicate with a second receptacle 2550 in a second electronic device. In various embodiments of the present invention, the first receptacle 2510 may be housed in a host device, wherein the second receptacle 2550 may be housed in an accessory device. Various signals may be present at receptacle 2510. This may include power supplies on lines 2512, high-speed differential signals on lines 2514, low-speed or control protocol signals on lines 2518, and identification pins 2516.

Plug 2520 may be inserted into receptacle 2510. Connector insert 2520 may have a grounded pin 2570, which may be used by receptacle 2510 in determining an orientation of connector insert 2520. Cable 2530 may convey power supplies and signals between connector insert 2520 and connector insert 2540. Connector insert 2540 may be inserted into connector receptacle 2550. Connector insert 2540 may include a grounded pin that may be used by receptacle 2550 in determining an orientation of connector insert 2540.

In various embodiments of the present invention, it may be important to limit the timing skew between various differential pair signals, and between the two signals making up a differential pair. Accordingly, embodiments of the present invention may include active circuitry to reduce this skew. An example is shown in the following figure.

Figure 26:
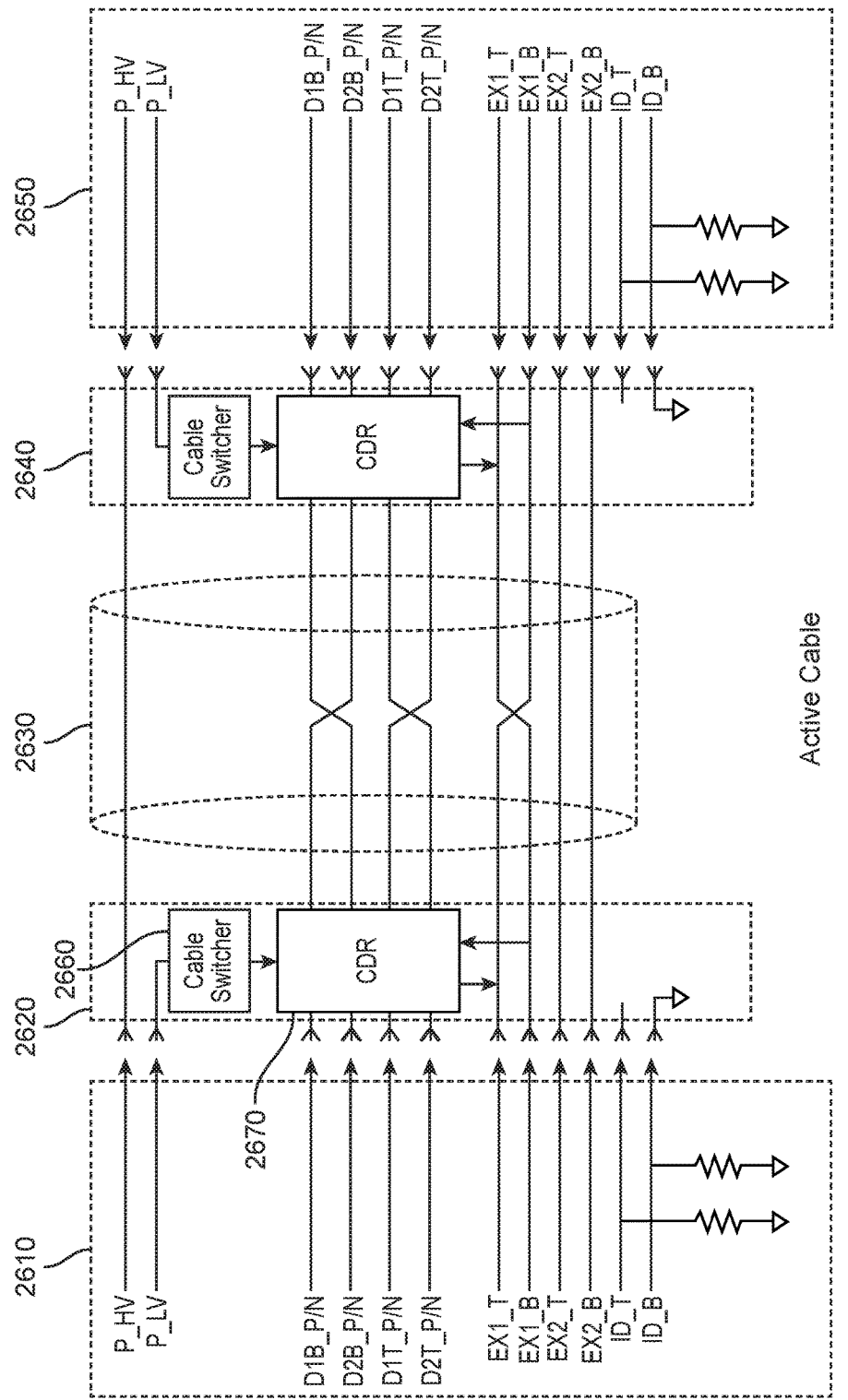
FIG. 26 illustrates an active cable assembly according to an embodiment of the present invention.

FIG. 26 illustrates an active cable assembly according to an embodiment of the present invention. Similar to the example above, connector insert 2620 may be inserted into receptacle 2610. Receptacle 2610 may be housed in a host or other type of device. A cable 2630 may convey power and signals between connector insert 2620 and connector insert 2640. Connector insert 2640 may be inserted into receptacle 2650. Receptacle 2650 may be housed in an accessory or other type of device. One or more of the connector inserts may house clock and data recovery circuits 2670. These clock and data recovery circuits may retime data signals received from a cable or receptacle. For example, clock and data recovery circuit 2670 in connector insert 2620 may retime signals received by connector receptacle 2610 or cable 2630. Similarly, clock and data recovery circuitry in connector insert 2640 may retime data signals received from receptacle 2650 or cable 2630. The clock and data recovery circuitry may be powered by cable switcher circuits 2660. These circuits may be powered down and passive signal paths may be used in lower speed applications to save power.

Again, embodiments of the present invention may provide cable assemblies having different types of plugs at each end of the cable. For example, embodiments of the present invention may provide cable assemblies having a unified plug at one end and a Thunderbolt or mini DisplayPort plug at the other. An example is shown in the following figure.

Figure 27:
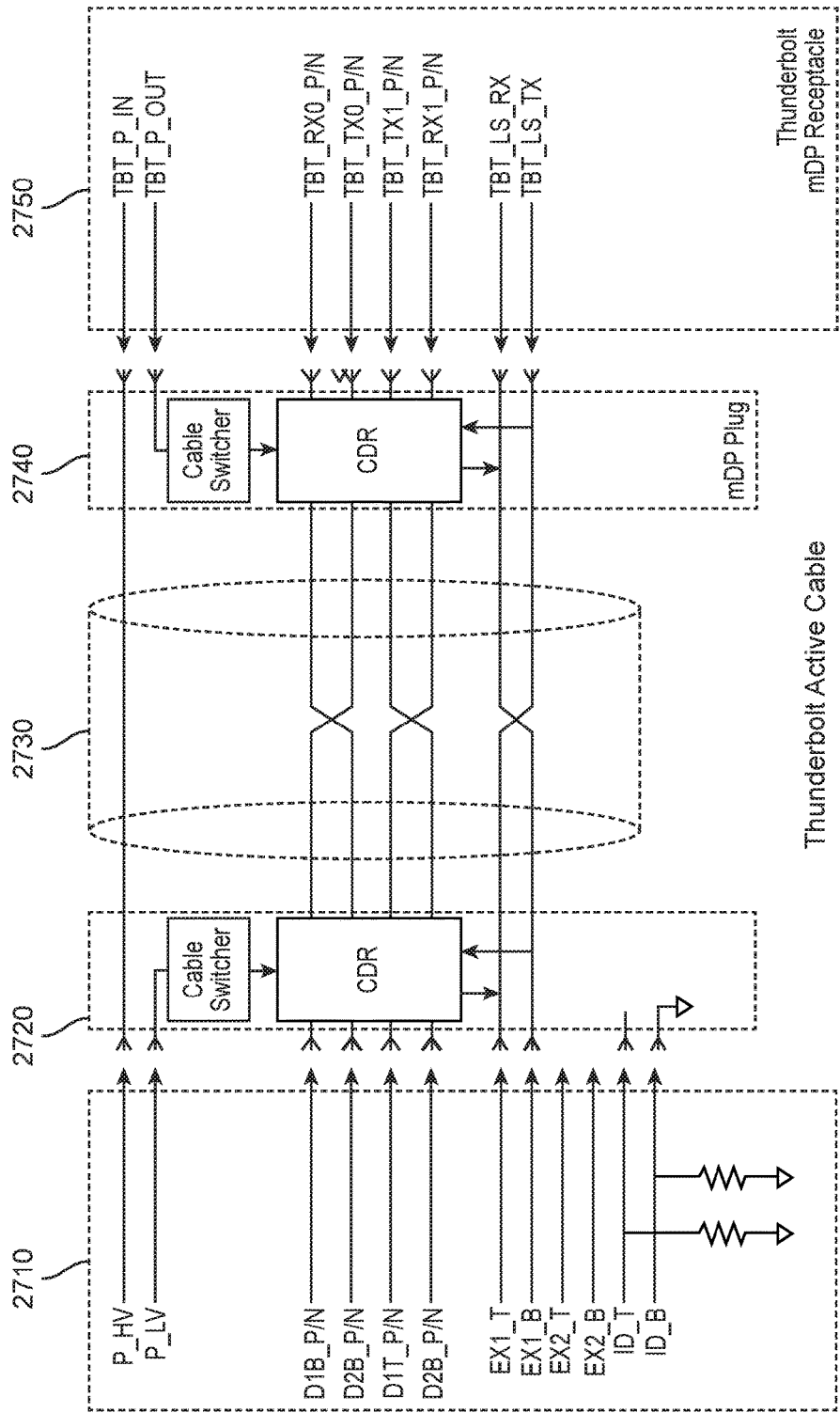
FIG. 27 illustrates a connector assembly according to an embodiment of the present invention.

FIG. 27 illustrates a connector assembly according to an embodiment of the present invention. In this example, receptacle 2710 and connector insert 2720 may be unified connectors. Cable 2730 may convey signals between connector insert 2720 and connector insert 2740. Connector insert 2740 may be a mini DisplayPort or Thunderbolt connector insert. Connector insert 2740 may be inserted into receptacle 2750.

Connector insert 2720 may include a grounded pin for orientation detection and clock and data recovery circuitry as before. Since a mini DisplayPort plug has only one orientation, no grounded pin is necessary to assist receptacle 2750 in determining an orientation of connector insert 2740. Connector insert 2740 may include clock and data recovery circuitry, as before.

In lower speed applications, passive cables may be used. Use of a passive cable may save power and reduce costs. An example of such a passive cable is shown in the following figure.

Figure 28:
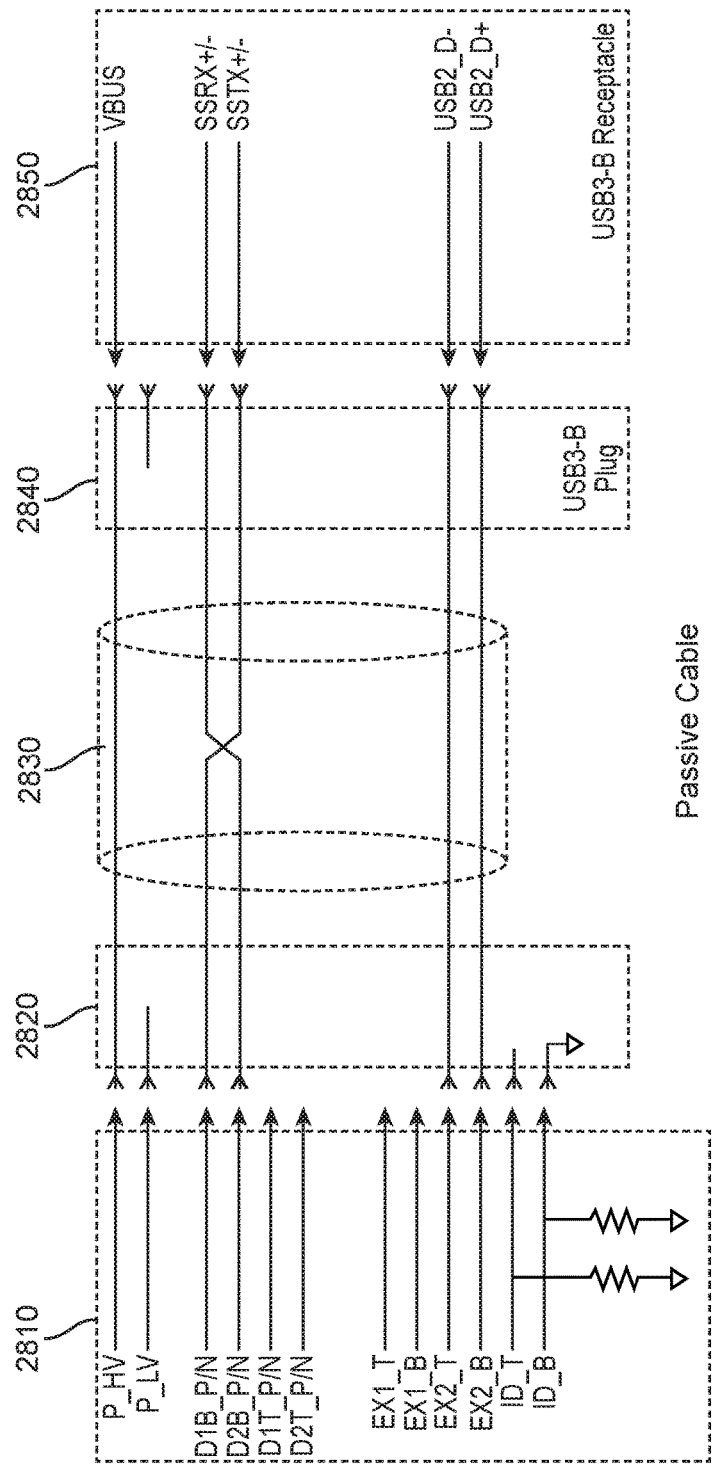
FIG. 28 illustrates a passive cable assembly according to an embodiment of the present invention.

FIG. 28 illustrates a passive cable assembly according to an embodiment of the present invention. In this example, receptacle 2810 and connector insert 2820 may be unified connectors. Connector insert 2820 may include a grounded pin for use by receptacle 2820 in determining an orientation of connector insert 2820. Cable 2830 may convey power and signals between connector insert 2820 and connector insert 2840. Connector insert 2240 may be a USB plug that is inserted into the USB receptacle 2850. As in the other examples, connector receptacle 2810 may be housed in a host or accessory device, while connector receptacle 2850 may be housed in an accessory or a host or device.

Again, embodiments of the present invention may provide cable receptacles and cable inserts that may convey high-speed differential pair signals, low-speed control signals, USB signals, power, and orientation detect signals. Various cables may be used to convey these signals. Examples are shown in the following figures.

Figure 29:
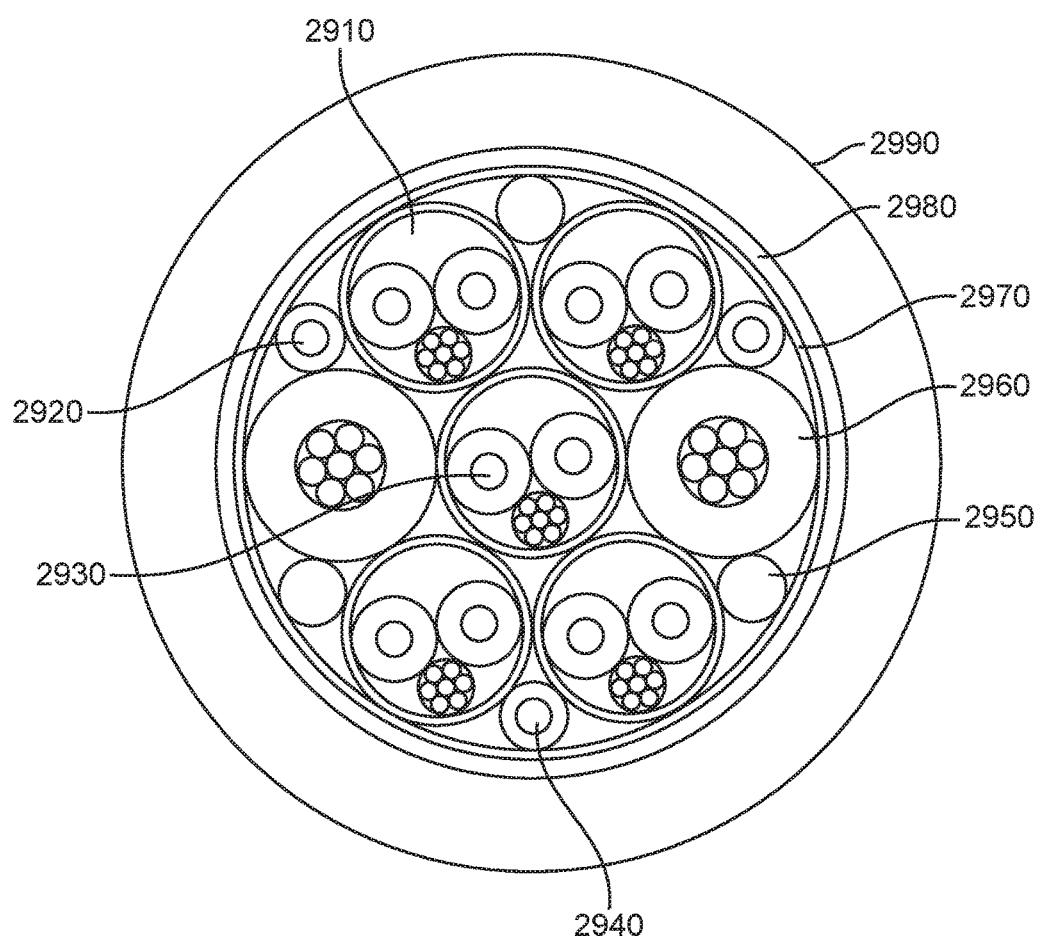
FIG. 29 illustrates a cross-section of a cable according to an embodiment the present invention.

FIG. 29 illustrates a cross-section of a cable according to an embodiment the present invention. This cable may include four high-speed pairs 2910, two low-speed signal paths 2920, and a USB signal pair 2930. One detect signal path 2940 may also be included. Three fillers 2950 may also be included. One or more power conductors 2960 may be included. In this example, two power connectors 2960 are included. Tape layer 2980 may hold these conductors together and ground shield 2970 may provide isolation and a return ground path. An insulating jacket 2990 may provide mechanical support for the cable.

In another embodiment of the present invention, it may be desirable to include two USB differential pairs. In this case, a USB signal pair may replace a power connector. The replaced power connector, may in turn replace one or more fillers 2950. An example is shown in the following figure.

Figure 30:
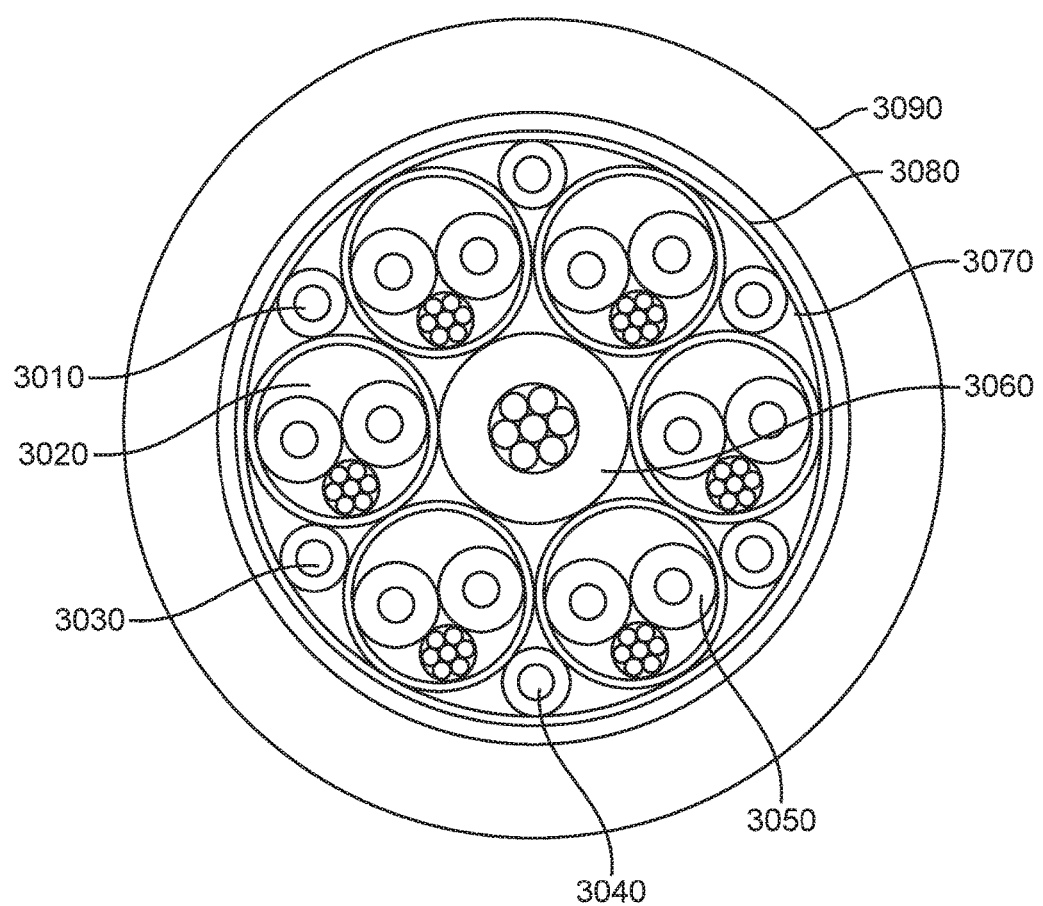
FIG. 30 illustrates another cross-section of a cable according to an embodiment the present invention.

FIG. 30 illustrates a cross-section of another cable according to an embodiment of the present invention. This example may include two low-speed signal paths 3010, two USB signal pairs 3020, three power paths 3030, detect signal path 3040, four high-speed differential signal pairs 3050, and a central power conductor 3060. As before, a tape layer 3080 may bind these connectors together and may be insulated by shield 3070. Insulating jacket 3090 may cover the cable and provide mechanical support.

Conventionally, at least one USB differential pair signal may be a relatively low-speed signal. Accordingly, a USB signal pair may not need a twisted pair conductor such as conductor 3020. Instead, two independent conductors may be used. This in turn may allow for the inclusion of two larger power conductors. An example is shown in the following figure.

Figure 31:
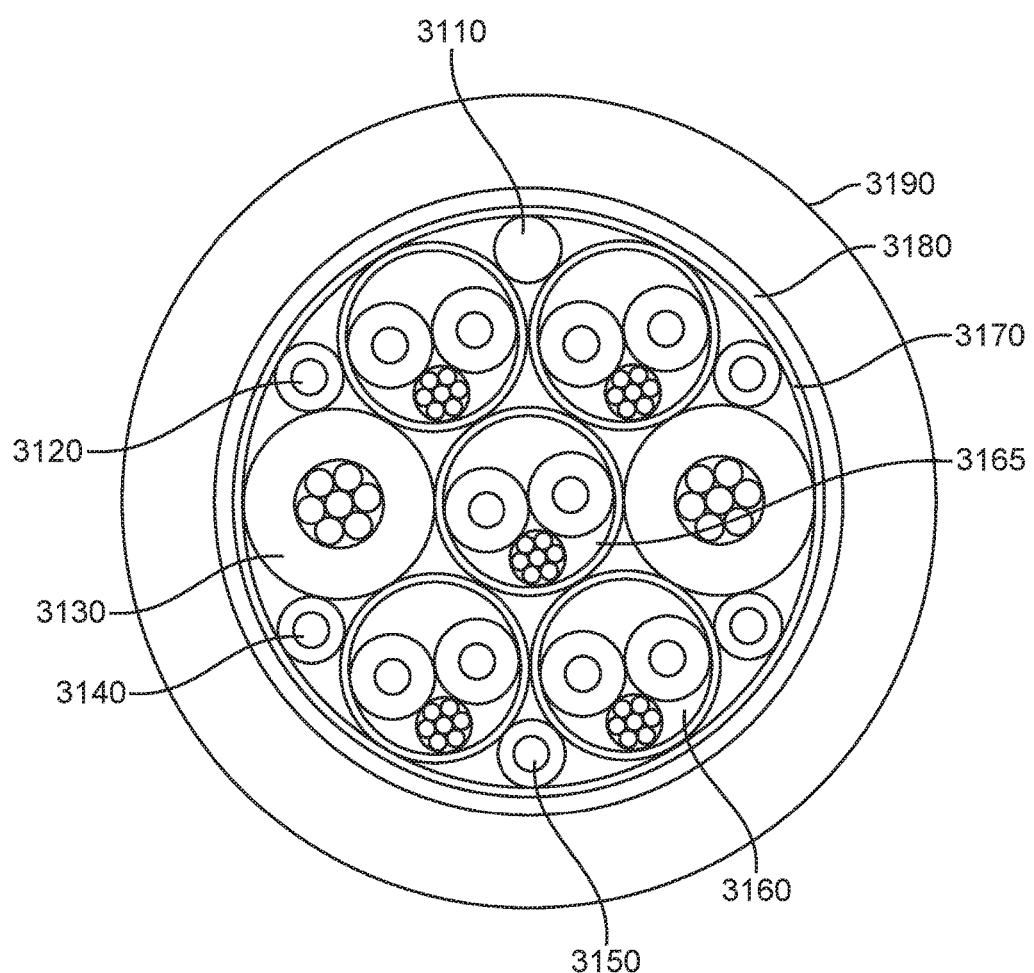
FIG. 31 illustrates another cross-section of a cable according to an embodiment the present invention.

FIG. 31 illustrates a cross-section of another cable according to an embodiment of the present invention. This example may include filler 3110, two low-speed signal paths 3120, two power conductors 3130, two single ended USB conductors 3140, a detect signal path 3150, four high-speed differential pairs 3160, and a differential USB signal path 3165. As before, tape layer 3170, shield 3180, and jacket 3190 may be included.

In these examples, high-speed and USB differential pairs may be conveyed using shielded-twisted pair, unshielded twisted-pair, coaxial, twinaxial, or other types of conductors. These conductors may include shielding and return lines. The power conductors may be made up of multiple strands of wires housed in insulating jacket. The fillers maybe aramid, cotton, or they may be other types of fibers. The signal conductors may be formed of one or more wires running in parallel, and the signal conductors may be individually encased in insulating jackets.

Specifically, USB and high-speed differential signals may be conveyed over twisted-pair conductors, such as twisted-pair conductors 3160. In other embodiments of the present invention, other types of conductors may be used to convey USB and high-speed differential signals. For example, one or more coaxial cables may be used. An example is shown in the following figure.

Figure 32:
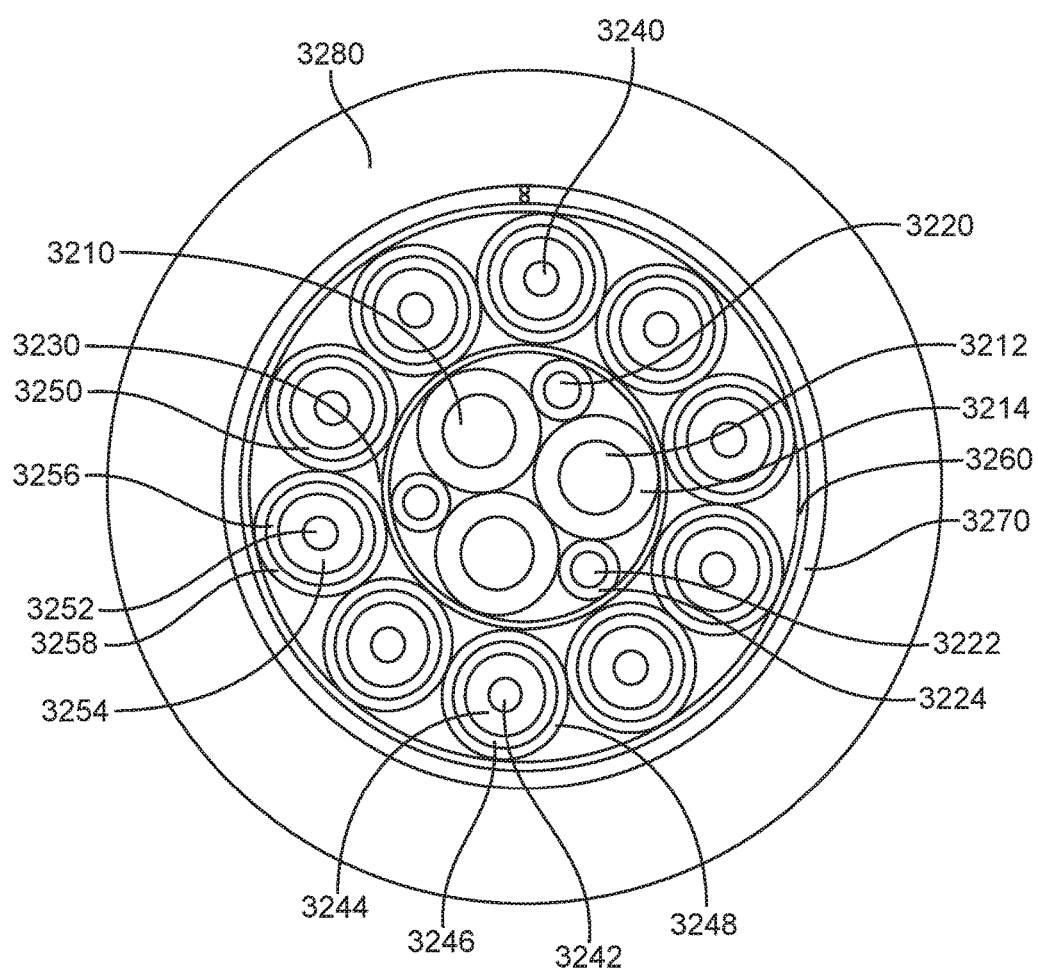
FIG. 32 illustrates another cross-section of a cable according to an embodiment the present invention.

FIG. 32 illustrates a cross section of another cable according to an embodiment of the present invention. This cable may include a number of power lines, a number of low-speed signal lines, and a number of USB and high-speed signal lines. The USB and high-speed signal lines may be coaxial cables. Two coaxial cables may be used to convey each differential pair signal. These coaxial cables may be micro-coaxial cables. The coaxial cables for a differential pair may be adjacent to each other, or there may be intervening structures or conductors.

This specific example may include three power conductors 3210 comprising center conductors 3212 surrounded by insulating layer 3214. Three low-speed signal lines 3220 may also be included. Low-speed signal lines 3220 may each include center conductor 3222 surrounded by an insulating layer 3224. Power lines 3210 and low-speed signal lines 3220 may be bound together by Mylar or other layer 3230.

Two USB signal conductors 3240 may be included. The USB signal conductors may be coaxial cables. These coaxial cables may include a center conductor 3242 surrounded by insulating layer 3244. A shield layer 3246 may be included and maybe be insulated by insulating layer 3248. In this example, USB signal conductors 3240 may be included at a top and bottom positions of the cable cross-section.

Embodiments of the present invention may convey four high-speed differential signal pairs. Accordingly, eight high-speed conductors 3250 may be included. These may be shown as two groups of four on right and left hand sides of the cross section. High-speed conductors 3250 may be coaxial cables. Each coaxial cable 3250 may include a center conductor 3252 surrounded by insulating layer 3254. Shield layer 3256 may be insulated by insulating layer 3258. Mylar or other layer 3260 may secure these conductors, which may be shielded by shield layer 3270. Shield layer 3270 may be a braided shield, it may include one, two, or more than two layers of counter-rotating spirals, or it may be constructed in other ways. Jacket 3280 may surround and protect the cable.

During construction, these conductors may be twisted over a lay length before being insulated by jacket 3280. Shield layers 3256 around the high-speed conductors 3250 may be connected together at one or both ends of the cable.

In a specific embodiment of the present invention, the USB and high-speed coaxial conductors may have a characteristic impedance of 40, 45, 50, 65, or 90 ohms or other impedance. The center conductor 3522 may be formed of a number of wires, which may be arranged as a Litz wire. In various embodiments, 5, 7, 9, 15, 19, or other numbers of wires may be used. They may have various gauges, such as 38, 40, 42, 44, or other gauges or diameters. The power conductors 3212 may include other numbers of wires, such as 5, 7, 9, 15, 19 wires, having a gauge such as 38, 40, 42, 44, or other gauges or diameters. Similarly, the low-speed signal conductors 3222 may include other numbers of wires, such as 5, 7, 9, 15, 19 wires, having a gauge such as 38, 40, 42, 44, or other gauges or diameters.

In various embodiments of the present invention, only a subset of conductors in a cable may be needed for a particular application. For example, while this cable may be able to convey USB signals and four additional differential pairs, in some embodiments of the present invention, an application may only need the USB signals. In such an application, a cable having a subset of the illustrated conductors may be used to reduce costs. An example of such a simplified cable is shown in the following figure.

Figure 33:
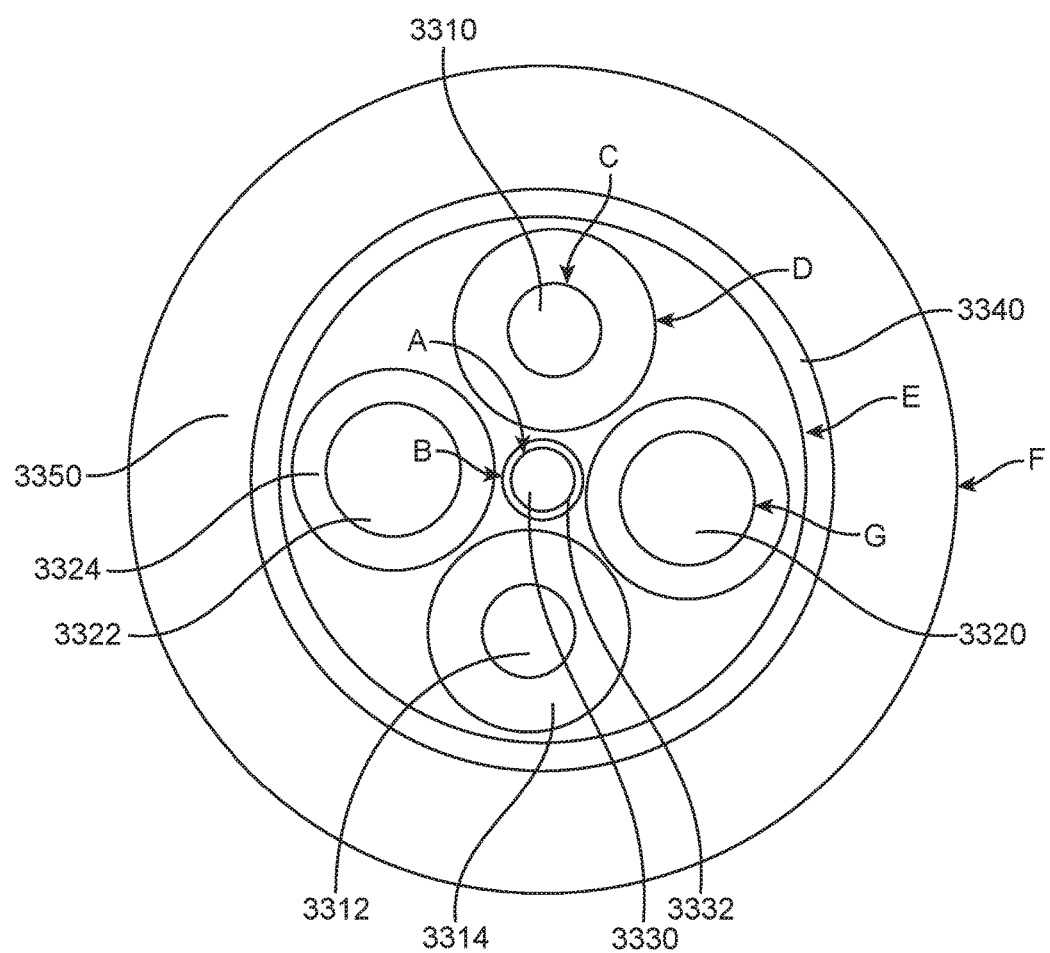
FIG. 33 illustrates another cross-section of a cable according to an embodiment the present invention.

FIG. 33 illustrates a cross-section of another cable according to an embodiment of the present invention. In this example, power and signals for a USB interface are provided, along with a low-speed signal conductor that may be used to convey a low-speed signal. This low-speed signal may be the CC signal described in the USB-C standard, though it may be another low-speed signal in other embodiments of the present invention.

More specifically, this cable may include two USB signal lines 3310, each including center conductors 3312 surrounded by insulating layers 3314. Two power conductors 3220 may be included. Power conductors 3320 may include center conductors 3322 surrounded by insulating layers 3324. These conductors may be surrounded by shield layer 3340. The cable may be protected by and surrounded by jacket 3350.

In this example, low-speed signal conductor 3330 may be included and may be surrounded by an insulating layer 3332. Low-speed signal conductor 3330 may be located in a center of the cable where it may be surrounded by signal conductors 3310 and power conductors 3320.

This cable may be manufactured in various ways consistent with embodiments of the present invention. In one example, low-speed signal conductor 3330, USB signal conductors 3310, and power conductors 3320 may be grouped as a bundle. Shield layer 3340 and other layers may be placed around the bundle of conductors. The resulting structure may be twisted along its length and jacket 3350 may be extruded and formed around the cable.

In other cables, low-speed signal conductor 3330 may alternatively be located towards the outside of the bundle of conductors 3310 and 3320. Unfortunately, when the cable bundle is twisted during manufacturing, the low-speed signal conductor 3330 may be stretched over a relatively long distance as it wraps around the outside of the cable bundle. Since low-speed conductor 3330 may be relatively thin, low-speed signal conductor 3330 may stretch and break during this twisting. Even when low-speed signal conductor 3330 does not break during this twisting, it made break during usage over the life of the cable. For this reason, low-speed signal conductor 3330 may be placed in the center of the cable, as shown. In this way, when the bundle of conductors is twisted during manufacturing, the low-speed signal conductor 3330 is not stretched as far and is less likely to break during manufacturing and later use.

When low-speed signal conductor 3330 is in a center of the cable bundle, the capacitance between low-speed signal conductor 3330 and the other conductors may increase as compared to when low-speed signal conductor 3330 may be on an edge of the cable bundle.

This increase in capacitance may increase signal coupling between low-speed signal conductor 3330 and the other conductors. Also, since the signal conductor impedance is inversely proportional to this capacitance, the impedance of low-speed signal conductor 3330 may be excessively high.

Accordingly, the geometries and dimensions of these structures may be adjusted in order to reduce coupling and improve signal line impedance. For example, dimension A, the diameter of low-speed signal conductor 3330, may have a diameter of 0.149, 0.174, 0.183, 0.192, or other value, where these and the other sizes listed in this example are in millimeters. It should be noted also that all sizes and ratios listed may have manufacturing tolerances associated with them. Dimension B, the outside diameter of the insulating layer 3332, may be 0.27, 0.3, 0.33, 0.36, or 0.40, or other diameter in size. Dimension C, the diameter of conductor 3310, may be 0.27, 0.3, 0.33, 0.36, or 0.40, or other diameter in size. Dimension D, the outer diameter of conductor 3310, may be 0.65, 0.74, 0.81, 0.89, or 0.94, or other diameter in size. Dimension E, the outer diameter of the conductor bundle, may be 1.65, 1.74, 1.81, 1.89, or 1.94, or other diameter in size. Dimension F, the outer diameter of the cable, may be 3.1, 3.2, 3.3, 3.4, or 3.5, or other diameter in size. Dimension G, the outer diameter of power conductor 3322, may be 0.4, 0.45, 0.5, 0.55, 0.6, 0.65, or other diameter in size.

In various embodiments of the present invention, these sizes may be scalable. For example, conductors in a longer cable may be made wider. The ratios of these dimensions may be controlled to maintain a desired level of cross-coupling, signal line impedance, and current capacity. For example, the ratio of the sum of the diameters of the conductors in the low-speed signal conductor 3330 and USB signal line conductor 3310 to the sum of their insulating layer diameters may be maintained as the cable is scaled in order to maintain improved (lowered) cross-talk between low-speed signal conductor 3330 and USB signal line conductors 3310. For example, the ratio of A plus C to B plus D may be maintained at a value less than 0.42, 0.47, 0.52, or 0.57, or other value, as the cable is scaled.

Similarly, the ratio of the diameter of conductor 3312 in USB signal line 3310 to the outer diameter of the cable bundle may be maintained near a value of 0.13, 0.16, 0.19, or 0.22 or other value as the cable is scaled. That is, the value of the ratio of C to E may be maintained near one of these values as the cable is scaled. This value may help to optimize the impedance of the USB signal lines 3310.

Also, the ratio of "n" times the diameter of conductor 3322 in power line 3320 to twice the outer diameter of the cable bundle may be maintained above a value as the cable is scaled. That is, the value of "n" times G to two times E may be maintained above of value of 0.23, 0.26, 0.29, or 0.32 or other value as the cable is scaled, where "n" is a length of the cable in meters. This value may help to ensure that the cable meets USB power requirements.

Again, embodiments of the present invention may provide connector receptacles that may provide or receive power. In a specific embodiment of the present invention, a first power supply may be provided where the power is provided to circuitry in one or more connector inserts in a cable assembly. For example, a connector insert plugged into a receptacle may draw power from this power supply. In other embodiments the present invention, a second connector insert located at a distant end of the cable may also receive power. In this and other embodiments of the present invention, a connector receptacle may include a second power supply connection. This second power supply connection may be provided in order to transfer power with an accessory or to receive power from a charger. This second power supply connection may be reversible, that is power may be provided to an accessory through this connection, or power may be received from an accessory or charger through this connection. An example of a power switch that may be employed in a receptacle according to an embodiment of the present invention is shown in the following figure.

Figure 34:
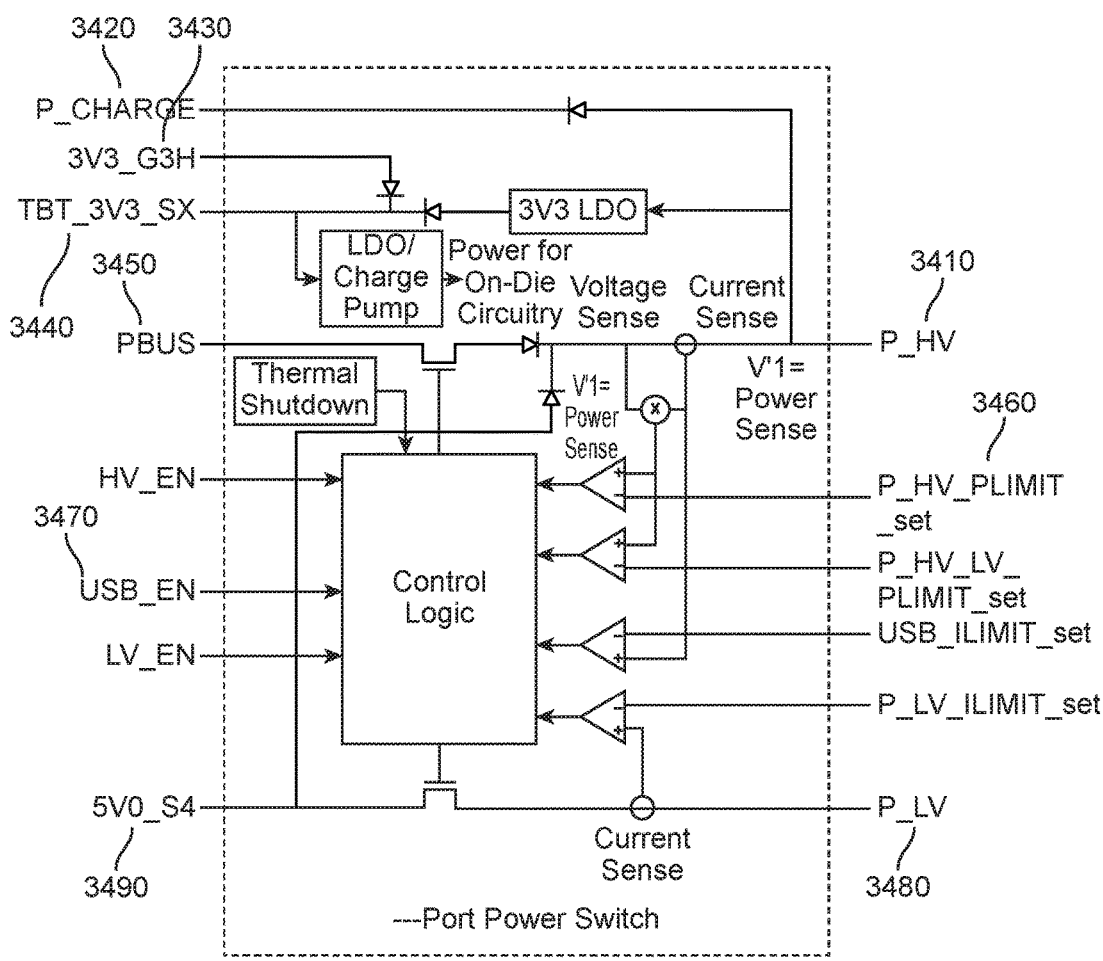
FIG. 34 illustrates a power switch according to an embodiment of the present invention.

FIG. 34 illustrates a power switch according to an embodiment of the present invention. Again, a first power supply voltage, PLV, may be provided on line 3480. This power supply voltage may be used to power electronics in one or more connector inserts of a cable assembly. For example, a receptacle housing this power switch may power circuitry in a connector insert that is inserted into the receptacle. This power switch may also power circuitry in a connector insert at a distant end of a connector assembly. A second power supply PHV may be provided on line 3410. This line may receive or accept power through a cable from an accessory, charger, or other appropriate circuitry or source. Various set lines 3460 and enable lines 3470 may control the enabling and disabling of these power supply lines. During initial connection, the power supply PHV on line 3410 may initially provide a relatively low voltage. Once identification of an accessory is completed, a higher output voltage and current availability may be provided.

In certain circumstances, an electronic device housing this power switch may be battery powered and may have a dead or discharged battery. In this case, the PLV supply on line 3480 is not enabled until a charging current is received on PHV line 3410. Once a charging voltage is received on line PHV 3410, then power may be provided on line PLV 3480 to circuitry in a connector insert that is inserted into a receptacle associated with this power switch.

Figure 35:
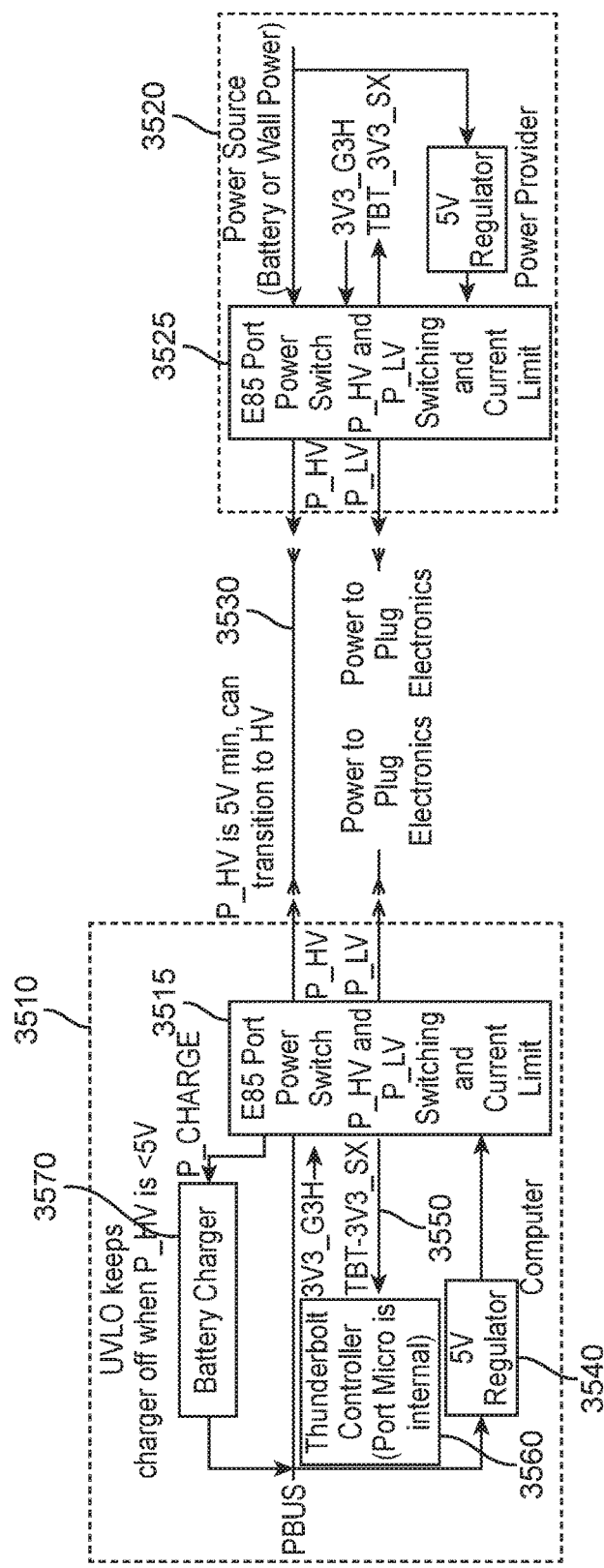
FIG. 35 illustrates a portion of the operation of a power switch according to an embodiment of the present invention.

FIG. 35 illustrates a portion of the operation of a power switch according to an embodiment of the present invention. This figure illustrates two power switches and associated circuitry 3510 and 3520. Power switch and associated circuitry 3510 may be located in a host computer having a dead battery, while power switch and associated circuitry 3520 may be located in an accessory drawing external power, a power charger, or other similar circuit configuration. In this example, power switch 3525 may provide power on line PHV 3530 to power switch and associated circuitry 3510. A regulator 3540 may receive this power and charge circuitry in power switch 3515. This may provide power on line 3550 to controller 3560. Controller 3560 may communicate with power switch and circuitry 3520 and negotiate a higher power level. In response, power switch 3545 may increase the power on line PHV 3530. This increase in power may enable battery charger 3570. Battery charger 3570 may then begin powering the discharged battery.

Devices incorporating power switches according to embodiments the present invention may receive and provide power from and to other types of devices. For example, devices having receptacles consistent with embodiments of the present invention may receive power from a Thunderbolt device. An example is shown in the following figure.

Figure 36:
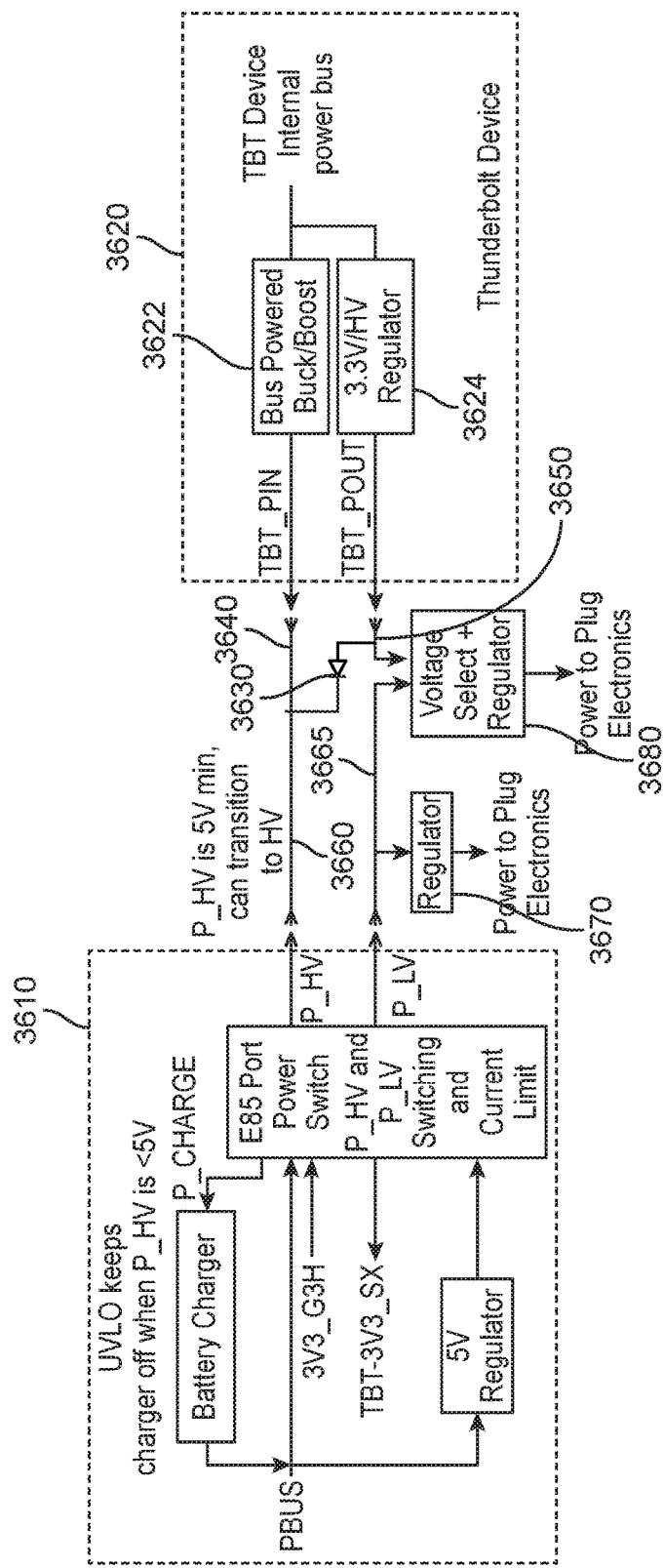
FIG. 36 illustrates a power switch and associated circuitry receiving power from receptacle circuitry of a thunderbolt device according to an embodiment of the present invention.

FIG. 36 illustrates a power switch and associated circuitry receiving power from receptacle circuitry of a Thunderbolt device according to an embodiment of the present invention. An ideal diode 3630 may be included. This ideal diode 3620 may be similar to an actual diode but having a lower voltage drop. This diode may act to provide power on line PHV 3060 from a bus powered regulator 3622 on line 3640 when the Thunderbolt device is bus powered, or from regulator 3624 on line 3650 when the Thunderbolt device is self-powered. In the case of the dead battery in a device housing power switch and associated circuitry 3610, once power is received on line 3660, power may be provided on line PLV 3665 to regulator 3670. Regulator 3670 may power electronics of a plug inserted into a receptacle associated with power switch and associated circuitry 3610. A Thunderbolt plug may be powered using regulator 3680. Regulator 3630 may receive power from either line PLV on line 3665 or from regulator 3624 on line 3650.

Figure 37:
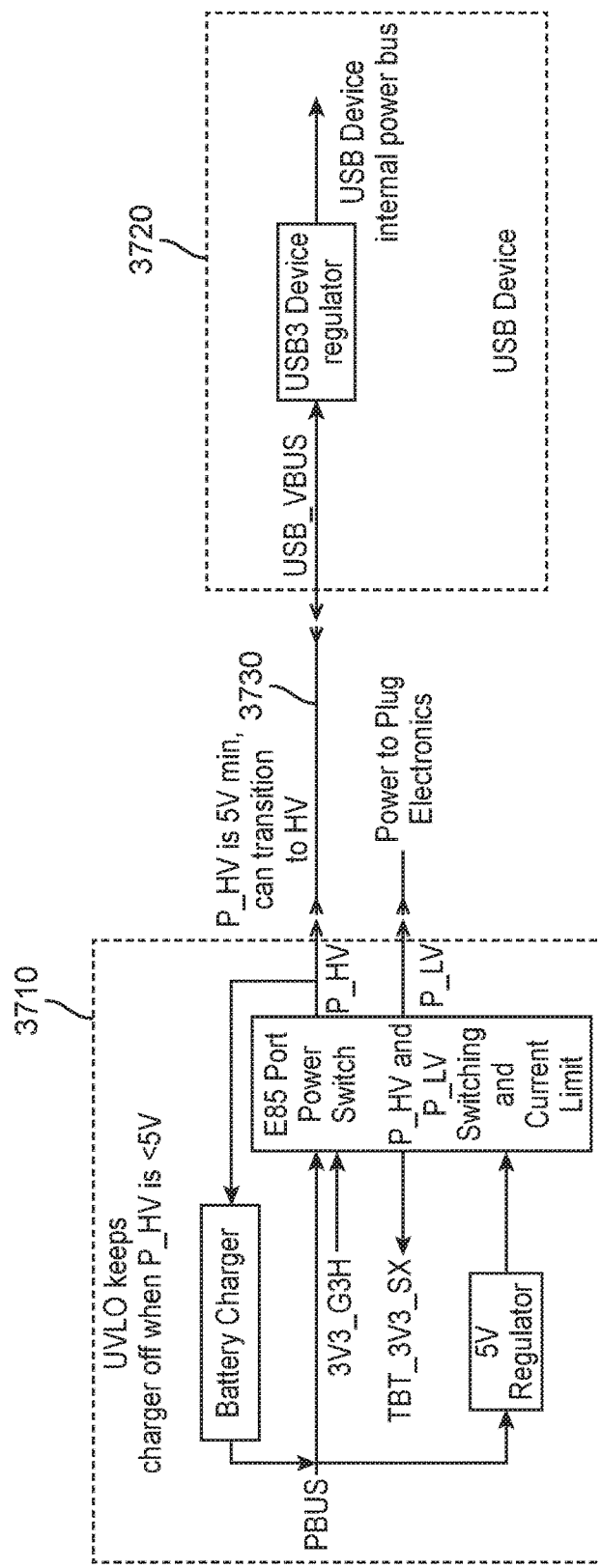
FIG. 37 illustrates a power switch and associated circuitry providing power to a USB device according to an embodiment of the present invention.

FIG. 37 illustrates a power switch and associated circuitry providing power to a USB device according to an embodiment of the present invention. Specifically, power switch associated circuitry 3710 may provide power on line PHV 3730 to circuitry 3720 in a USB device. In various embodiments of the present invention, power switch and associated circuitry 3710 may provide more power on line PHV 3730 then is anticipated or called for by a USB specification.

Again, embodiments of the present invention may receive or provide power. Accordingly, embodiments of the present invention may provide power to USB device as above, and may receive power from a USB device. In each case, the power provided or power received may exceed power levels comprehended or specified by USB specifications. An example of a device receiving power from a USB device is shown in the following figure.

Figure 38:
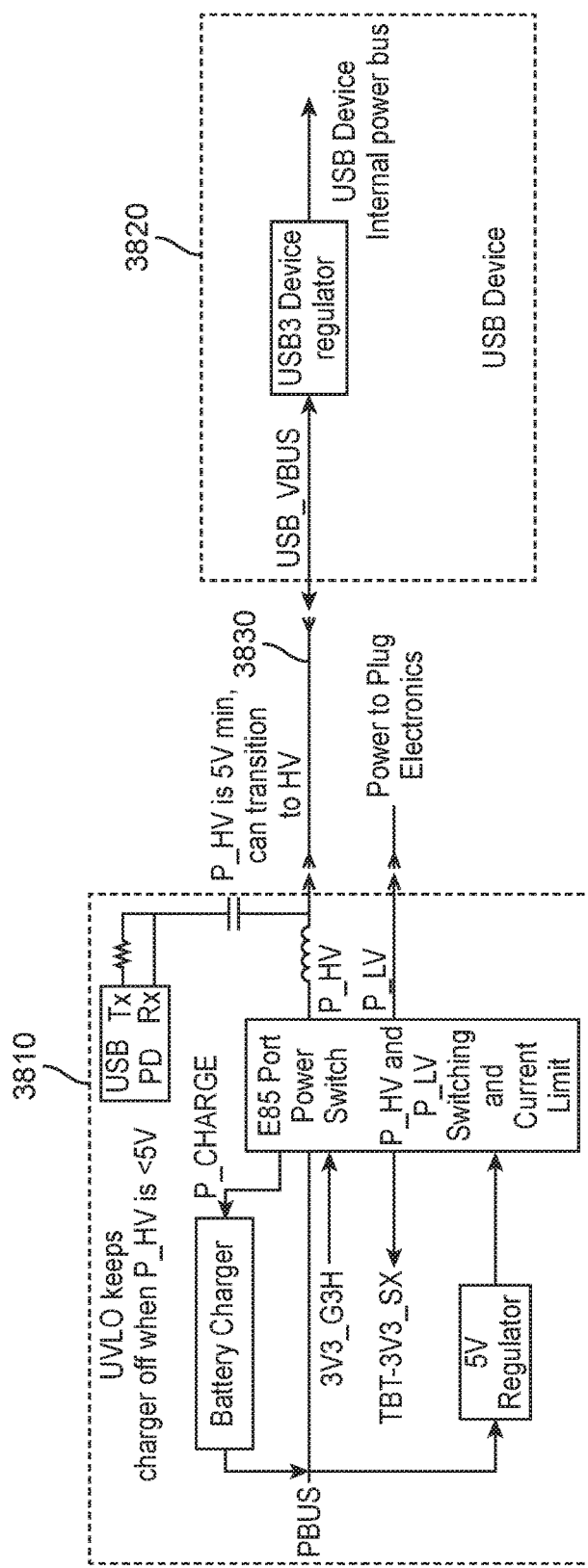
FIG. 38 illustrates a power switch and associated circuitry receiving power from a USB device according to an embodiment of the present invention.

FIG. 38 illustrates a power switch and associated circuitry receiving power from a USB device according to an embodiment of the present invention. In this example, circuitry 3820 in a USB device may provide power on line 3830 to a power switch and associated circuitry 3810. Again, this power may be higher than a power level comprehended or anticipated by a USB specification. As in the other examples, power switch and associated circuitry 3810 may be located in the host or an accessory device, while USB circuitry 3820 may be located in an accessory or a host device.

Various embodiments the present invention may employ unified connectors having various pinouts. Examples are shown in the following figures.

FIG. 39 illustrates a pinout for a unified connector according to an embodiment of the present invention. In this example, P is power and G is ground. Transmit and receive pairs are included, as are low-speed control lines. The connector may accept a charging power or provide accessory power on pins as well. A communication path comprising a low-speed interface may also be included. This low-speed interface may have various uses. For example, this low-speed interface may be used to communicate the identity of the legacy interface being used. Also, this low-speed interface may be used in detecting an orientation of a connector insert in a connector receptacle.

FIG. 40 illustrates a pinout for a unified connector according to an embodiment of the present invention. In this figure, charging power CP and accessory power AP pins have been removed to simplify the connector.

FIG. 41 illustrates another pinout of a unified connector according to embodiments of the present invention. In some circumstances, for various reasons, the pins of either a connector insert or connector receptacle may be very close to each in the vertical direction. Accordingly, it may be undesirable to place a power contact vertically over a ground contact, since these two pins may short in certain transitory or static circumstances. Accordingly, in this example, power pins and ground pins are placed over each other as shown. More specifically, a ground pin in a top row of contacts may be positioned directly above a ground pin in a bottom row of contacts, while a power pin in a top row of contacts may be positioned directly above a power pin in a bottom row of contacts. In this way when a connector insert is removed from a connector receptacle, ground contacts may contact ground contacts while power contacts may contact power contacts in the connector insert. Further, these ground and power pins may be symmetrically located such that when a connector insert is inserted, ground pins in the connector insert may connect to ground pins in the connector receptacle and power pins in the connector insert may connect to power pins in the connector receptacle regardless of whether the connector insert is inserted in a normal or reversed orientation.

FIG. 42 illustrates a mapping of pins for various types of interfaces to pins of a connector receptacle according to an embodiment of the present invention. In this example, mappings for DisplayPort and HDMI, for receiving and transmitting (sink and source), power chargers, and USB interfaces are shown.

In this configuration, each pin carries the same or similar type of signal when the connector is reversed. Power or ground pins isolate each high-speed differential pair. That is, each high-speed differential pair may be located between a power and a ground pin, two power pins, or two ground pins. In other embodiments of the present invention, other lines, such as control lines, orientation lines, status lines, or other low or DC signals may be placed adjacent to high-speed differential pairs for isolation purposes. Sufficient differential pairs, four, are included for DispayPort applications. A DC pair, RFU (or ID) is provided for orientation. These pins may also be used for identification. For example, these pins may be used to form a one or two pin ID bus that may be used to communicate ID and authentication information between devices. Some of the high-speed pairs may be configured as either receive or transmit, while others may be dedicated receive or transmit. Low-speed control pins are provided for USB, Thunderbolt, and other interfaces. The high-speed differential pairs may be either AC or DC coupled, while the lower-speed control lines may be either DC or AC coupled.

FIG. 43 illustrates a mapping of pins for various types of interfaces to pins of a connector receptacle according to an embodiment of the present invention.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A method of determining an orientation of a connector insert in a connector receptacle, the method comprising:
   determining whether a first pin in the connector receptacle is grounded, and if it is, then
   determining that the connector insert is inserted in the connector receptacle in a first orientation and providing a first voltage on a second pin of the connector receptacle, and
   if the first pin in the connector receptacle is not grounded, then
   determining whether the second pin in the connector receptacle is grounded, and if it is, then
   determining that the connector insert is inserted in the connector receptacle in a second orientation and providing the first voltage on the first pin of the connector receptacle.

2. The method of claim 1 wherein the method is initiated by a power-on-reset event.

3. The method of claim 2 wherein following a power-on-reset event, power supplies and signals are disconnected at the connector receptacle for a first duration.

4. The method of claim 3 wherein the first duration is approximately 5 milliseconds.

5. The method of claim 1 wherein the first voltage is provided by a host device to an accessory device.

6. The method claim 1 wherein determining whether a first pin in the connector receptacle is grounded is done by providing a pulsed signal to the first pin.

7. A method of determining an orientation of a connector insert of a cable assembly in a connector receptacle of an electronic device, the method comprising:
   with the electronic device, determining whether a first pin in the connector receptacle is grounded;
   when the electronic device determines that the first pin in the connector receptacle is grounded, then providing a first voltage on a second pin of the connector receptacle; and
   when the electronic device determines that the first pin in the connector receptacle is not grounded; then
   with the electronic device, determining whether the second pin in the connector receptacle is grounded; and
   when the electronic device determines that the first pin in the connector receptacle is grounded, then providing the first voltage on the first pin of the connector receptacle.

8. The method of claim 7 wherein the method is initiated by a power-on-reset event.

9. The method of claim 8 wherein following a power-on-reset event, power supplies and signals are disconnected at the connector receptacle for a first duration.

10. The method of claim 9 wherein the first duration is approximately 5 milliseconds.

11. The method of claim 10 wherein the first voltage is provided by the electronic device to an accessory device, the accessory device coupled to the cable assembly.

12. The method of claim 7 wherein the electronic device determines whether the first pin the connector receptacle is grounded by providing a pulsed signal to the first pin.

13. The method of claim 7 wherein the connector insert and the connector receptacle may be mated in at least two orientations.

14. A connector receptacle circuit to determine an orientation of a connector insert in a connector receptacle, the connector receptacle circuit to:
   determine whether a first pin in the connector receptacle is grounded;
   responsive to determining that the first pin in the connector receptacle is grounded, provide a first voltage on a second pin of the connector receptacle, and
   responsive to determining that the first pin in the connector receptacle is not grounded, then
   determine whether the second pin in the connector receptacle is grounded; and
   responsive to determining that the second pin in the connector receptacle is grounded, provide the first voltage on the first pin of the connector receptacle.

15. The connector receptacle circuit of claim 14 wherein the connector receptacle circuit determines whether a first pin in the connector receptacle is grounded in response to a power-on-reset event.

16. The connector receptacle circuit of claim 15 wherein following a power-on-reset event, power supplies and signals are disconnected at the connector receptacle for a first duration.

17. The connector receptacle circuit of claim 16 wherein the first duration is approximately 5 milliseconds.

18. The connector receptacle circuit of claim 17 wherein the first voltage is provided by a host device to an accessory device.

19. The connector receptacle circuit of claim 14 wherein the connector receptacle circuit determines whether the first pin the connector receptacle is grounded by providing a pulsed signal to the first pin.

20. The connector receptacle circuit of claim 14 wherein the connector insert and the connector receptacle may be mated in at least two orientations.

* * * * *